United States Patent [19]
Hirao et al.

[11] Patent Number: 5,646,827
[45] Date of Patent: *Jul. 8, 1997

[54] ELECTRONIC DEVICE HAVING A PLURALITY OF CIRCUIT BOARDS ARRANGED THEREIN

[75] Inventors: Yasunobu Hirao, Toyokawa; Takashi Nagasaka, Anjo; Yuji Motoyama, Okazaki; Yukihiro Maeda, Kasugai, all of Japan

[73] Assignee: Nippondenso Co., Ltd., Kariya, Japan

[*] Notice: The term of this patent shall not extend beyond the expiration date of Pat. No. 5,408,383.

[21] Appl. No.: 400,241

[22] Filed: Mar. 6, 1995

Related U.S. Application Data

[63] Continuation-in-part of Ser. No. 118,785, Sep. 10, 1993, Pat. No. 5,408,383, which is a continuation of Ser. No. 889,701, May 29, 1992, abandoned.

[30] Foreign Application Priority Data

May 31, 1991 [JP] Japan ................................. 3-157678

[51] Int. Cl.$^6$ ................................................ H05K 7/20
[52] U.S. Cl. .................... 361/707; 361/715; 361/730; 361/752; 361/772
[58] Field of Search ................................. 361/690, 704, 361/707–711, 715, 717–718, 722, 730, 752, 772

[56] References Cited

U.S. PATENT DOCUMENTS

| | | |
|---|---|---|
| 3,710,193 | 1/1973 | Greenberg et al. . |
| 4,074,342 | 2/1978 | Honn et al. . |
| 4,296,456 | 10/1981 | Reid . |
| 4,533,976 | 8/1985 | Suwa . |
| 4,677,526 | 6/1987 | Muehling . |
| 4,766,520 | 8/1988 | Huber et al. . |
| 4,802,859 | 2/1989 | Gouldy et al. . |
| 4,873,615 | 10/1989 | Grabbe . |
| 4,916,575 | 4/1990 | Van Asten . |
| 4,985,747 | 1/1991 | Utunomiya et al. . |
| 4,989,318 | 2/1991 | Utunomiya et al. . |
| 5,031,069 | 7/1991 | Anderson . |
| 5,045,971 | 9/1991 | Ono et al. . |
| 5,081,764 | 1/1992 | Utunomiya et al. . |
| 5,157,588 | 10/1992 | Kim et al. . |
| 5,408,383 | 4/1995 | Nagasaka et al. ............. 361/707 |

FOREIGN PATENT DOCUMENTS

| | | |
|---|---|---|
| 0335249 | 10/1989 | European Pat. Off. . |
| 0346035 | 12/1989 | European Pat. Off. . |
| 2554965 | 7/1976 | Germany . |
| 1147850 | 6/1989 | Japan . |
| 0170598 | 7/1990 | Japan . |

OTHER PUBLICATIONS

Patent Abstracts of Japan, vol. 13, No. 407, p. 60 E 818, Kokai No. 1–147, 850 English Abstract, Jun. 1989.

*Primary Examiner*—Gregory D. Thompson
*Attorney, Agent, or Firm*—Cushman, Darby & Cushman IP Group of Pillsbury Madison & Sutro LLP

[57] ABSTRACT

In order to provide an electronic device that has high package density and can facilitate electrical connection between a plurality of circuit boards therein, the electronic device comprises a frame having two mutually opposed openings through major planes, a plurality of circuit boards disposed in the frame parallel to the major plane, and mounted selected electronic circuits thereon respectively, and first and second closure lids for closing the openings in the major plane; the first closure lid contacting with the surface of at least one of the circuit boards, on which no electronic circuit is mounted. Also, on the inner wall of the frame; appropriate stepped portions are formed for supporting the closure lid member, the supporting plate, the circuit board and so forth, Furthermore, in the stepped portion, a portion to accommodate an excess amount of an adhesive is provided.

6 Claims, 28 Drawing Sheets

ELECTRONIC DEVICE HAVING A PLURALITY OF CIRCUIT BOARDS ARRANGED THEREIN

RELATED APPLICATIONS

This application is a continuation-in-part of Nagasaka et al. appln. Ser. No. 08/118,785, filed Sep. 10, 1993, now U.S. Pat. No. 5,408,383, which was a continuation of application Ser. No. 07/889,701, filed May 29, 1992, now abandoned, and claims foreign priority from Japanese patent application No. 3-157678 filed May 31, 1991, the content of all of these applications being incorporated hereinto by this reference.

BACKGROUND OF THE INVENTION

1. Field of the Invention

The present invention relates generally to an electronic device that can improve packaging density. More specifically, the invention relates to an electronic device that can improve the efficiency of an electrical connection between circuit boards and the effect of heat radiation, and prevent adverse effects from heat radiation, in a multi-board construction of the circuit boards. Furthermore, the invention relates to an electronic device and a lead and a terminal adapted to the electronic device for facilitating a connection of the boards and a lid member.

2. Description of the Related Art

In the prior art, there are known electronic devices in which two or more circuit boards having installed semiconductor integrated circuits are packed in a single package. (For example, Japanese Unexamined Patent Publication (Kokai) No. 1-147850).

For such devices, various improvements have been made for facilitating the wiring between two or more circuit boards. Also, for external signalling, lead pins have been employed.

Conventionally, two or more circuit boards forming a multi-board structure have been bonded within the package.

In such a construction of the electronic device, the heat generated in the semiconductor circuits in the circuit board is transmitted to the package through the circuit board, or, as an alternative, is radiated within the internal space of the package. Accordingly, heat can be accumulated within the package that exhibits a low heat radiation effect.

On the other hand, since the conventional electronic device is designed to establish electrical connection between the circuit boards through the lead pins, which are used for externally feeding a signal, when signals are not commonly output externally, the lead pins have to be dummy pins, thereby resulting in a reduction in the number of active pins for externally outputting the signals.

Also, since the electrical wiring between a plurality of circuit boards is used in common to the lead pins, the number of connections to be established between the circuit boards is limited. In the case of the electronic device in which the packaging density of the elements is increased, the amount of wiring for connecting the circuit boards becomes large. Therefore, solving this problem is an important task.

In such an electronic device, bonding of the circuit board onto the package has been performed without adequate care. Therefore, an excessive amount of adhesive on the bonding surface may bulge to the surface of the circuit board, or may drop on the lower circuit board.

Such an excess amount of adhesive can serve to increase the floating electrostatic capacity or cause a dielectric breakdown, or can be a cause of a failure of electric connection by adhering to the bonding portion on the circuit board. Also, when the adhesive adheres to the connection lead for an electrical connection between the circuit boards, an abnormal transmission of the bonding power can occur in the connecting process of the substrate and the connection lead by way of wire bonding to result in a bonding failure. Furthermore, it is possible that the heat radiation effect is lowered because of the adhesive, thus causing distortion, cracking, degradation of the characteristics owing to a difference in thermal expansion coefficients between the adhesive, the substrate and the connection leads and so forth.

On the other hand, it is typical to coat the upper portion of the circuit board installing the electronic circuit with a gel form coating agent for moisture-proofing. In such a case, a coating agent that is in the liquidous state at the initial condition, can bulge up along the side wall inside of the frame because of surface tension thereof to adhere on the horizontal surface of the installation guide for the upper circuit board and thus cause a failure of connection between the upper circuit board and the frame. Also, the gel form coating agent can contain foam and therefore degrade the moisture-proofing effect.

Furthermore, when the coating agent adheres on the connection lead for an electrical connection between the circuit boards, it can cause an electrical connection failure similar to the adhesive agent.

SUMMARY OF THE INVENTION

In view of the above-mentioned drawbacks in the prior art, it is a first object of the present invention to provide an electronic device that can improve the heat radiation effect of the electronic device packaging a plurality of circuit boards in a multi-board structure.

A second object of the present invention is to provide an electronic device that can facilitate electrical connection between the circuit board in the electronic device installing a plurality of circuit boards in a multi-board structure.

A third object of the invention is to provide the electronic device that facilitates connection of the circuit boards of the electronic device installing a plurality of circuit boards in the multi-board structure in the package and prevent harmful effects from the adhesive used in the electronic device and prevent the occurrence of connection failure.

On the other hand, in the above-mentioned construction of the electronic device, in addition to the foregoing drawbacks, there have been many problems in the structure of a lead and a terminal. Namely, when the lead and the terminal of the electronic device are connected by way of electric welding, the region of the terminal to be welded is formed into a projection, causing a concentration of the current in the welding region. Alternatively, the tip end of the welding electrodes are formed into an acute angle.

However, in the above-mentioned method, when the projecting portion is placed in contact with the lead wire, the lead wire slips easily, thereby making it difficult to accurately position the lead wire relative to the projection on the terminal.

Therefore, a fourth object of the present invention is to provide lead and terminal structures that facilitate positioning of the lead relative to the terminal and easily produce a concentration of the current.

In order to accomplish the above-mentioned object, an electronic device, according to the present invention, fundamentally comprises:

a frame having two openings through major planes mutually opposed;

a plurality of circuit boards disposed in the frame parallel to the major plane, and mounting selected electronic circuits thereon respectively; and first and second closure lids for closing the openings in the major plane; the first closure lid contacting the surface of at least one of the circuit boards, on which no electronic circuit is mounted.

More practically, the electronic device comprises:

a resin frame having an opening at both end surfaces;

a first metal plate closing one of the openings of the frame;

a first circuit board formed on the surface of the first metal plate facing inside of the frame;

a first electronic circuit mounted on the first circuit board and handling a relatively large current for generating a relatively large amount of heat;

a second circuit board arranged at the intermediate position in the frame above the first electronic circuit in parallel relationship to the first metal plane;

a second electronic circuit arranged on the second circuit board and handling less power than the first electronic circuit for generating a smaller amount of heat; and a closure lid for closing the opening at the opposite side of the opening closed by the first metal plate.

BRIEF DESCRIPTION OF THE DRAWINGS

The present invention will be more fully understood from the following detailed description and from the accompanying drawings of the preferred embodiment of the invention, which, however, should not be taken to present the invention, but are for explanation and understanding only.

In the drawings.

DESCRIPTION OF THE PREFERRED EMBODIMENT

The preferred embodiment of an electronic device according to the present invention will be discussed herebelow in detail with reference to the accompanying drawings.

Figure 1:
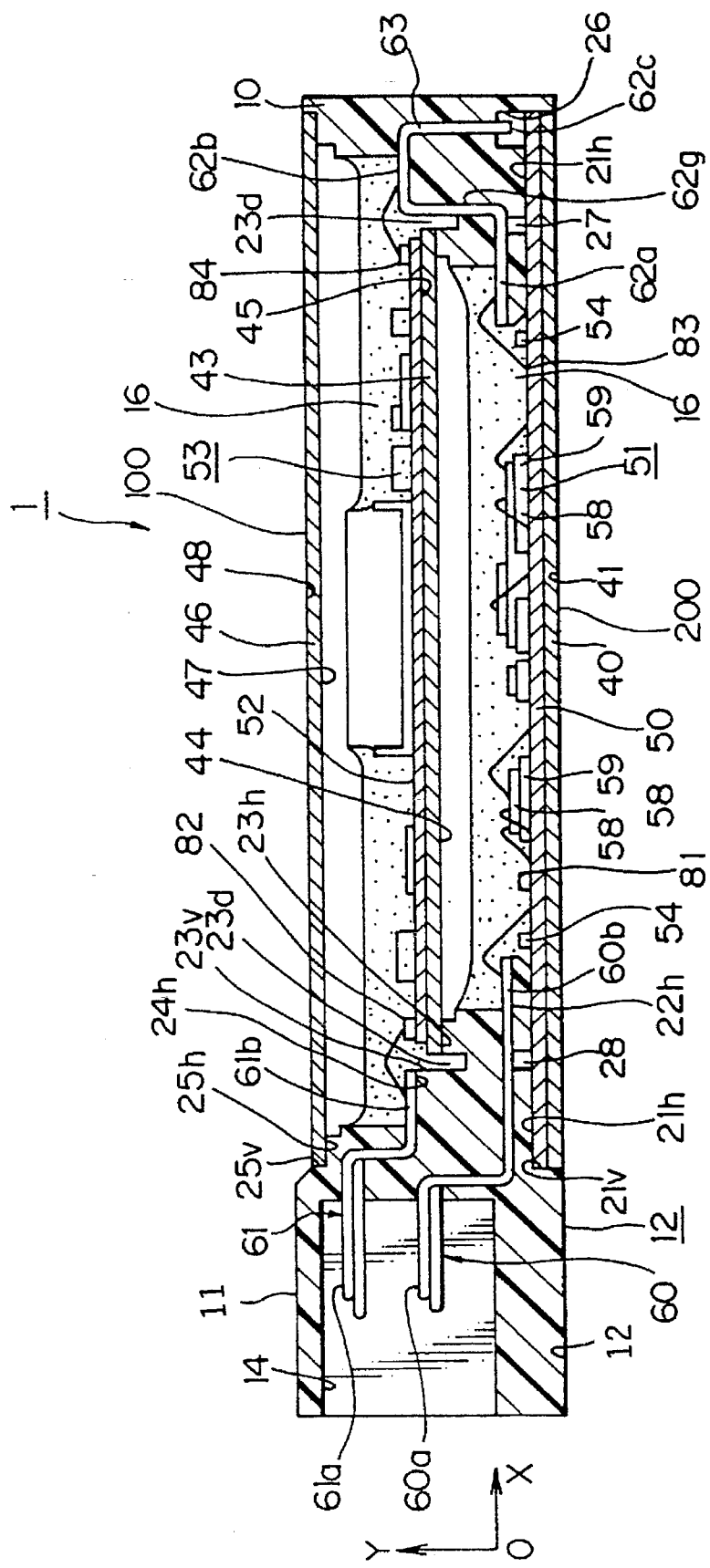
FIG. 1 is a section of a practical embodiment of an electronic device according to the present invention.
Figure 2:
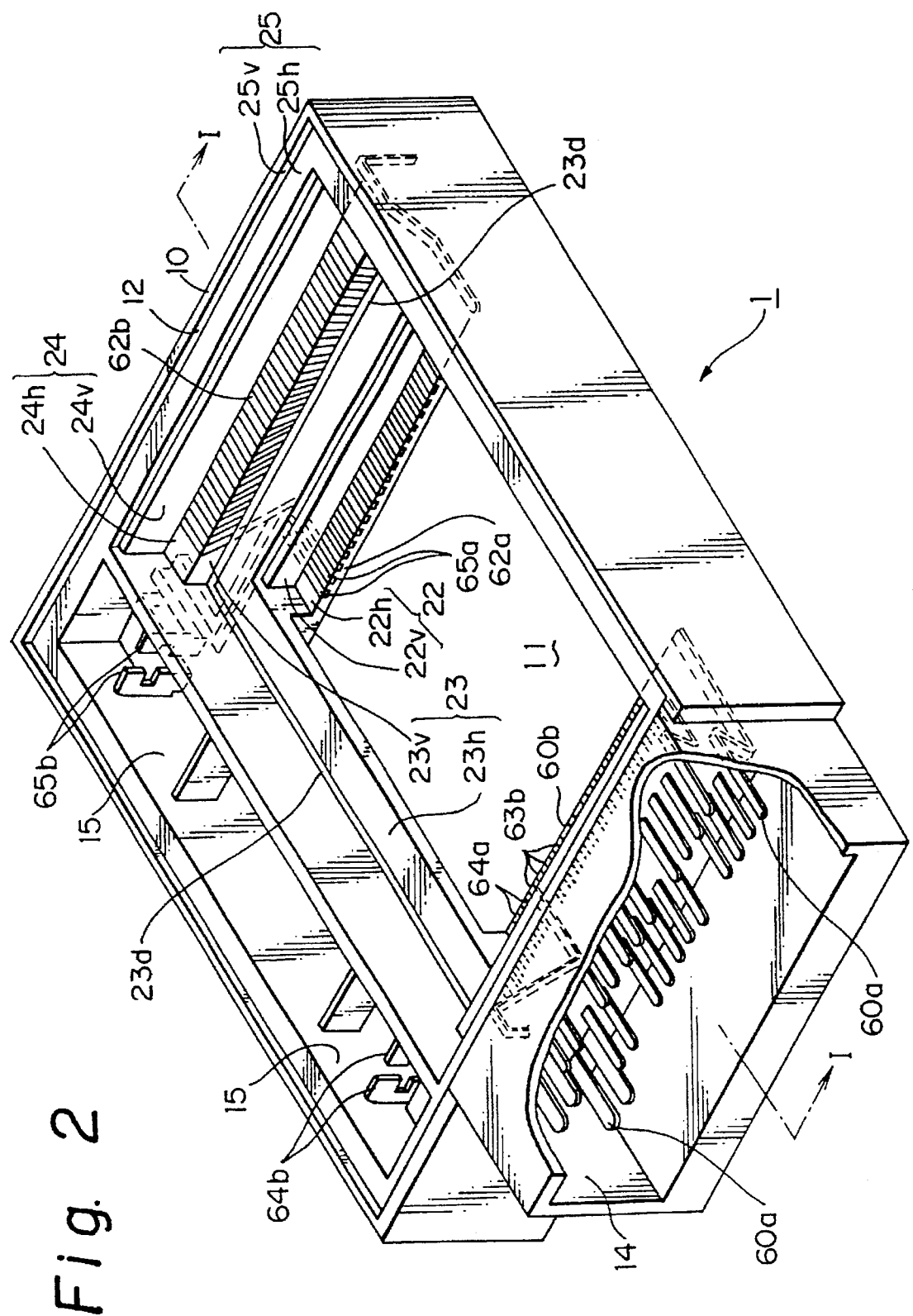
FIG. 2 is a perspective view of a frame of the electronic device.
Figure 3:
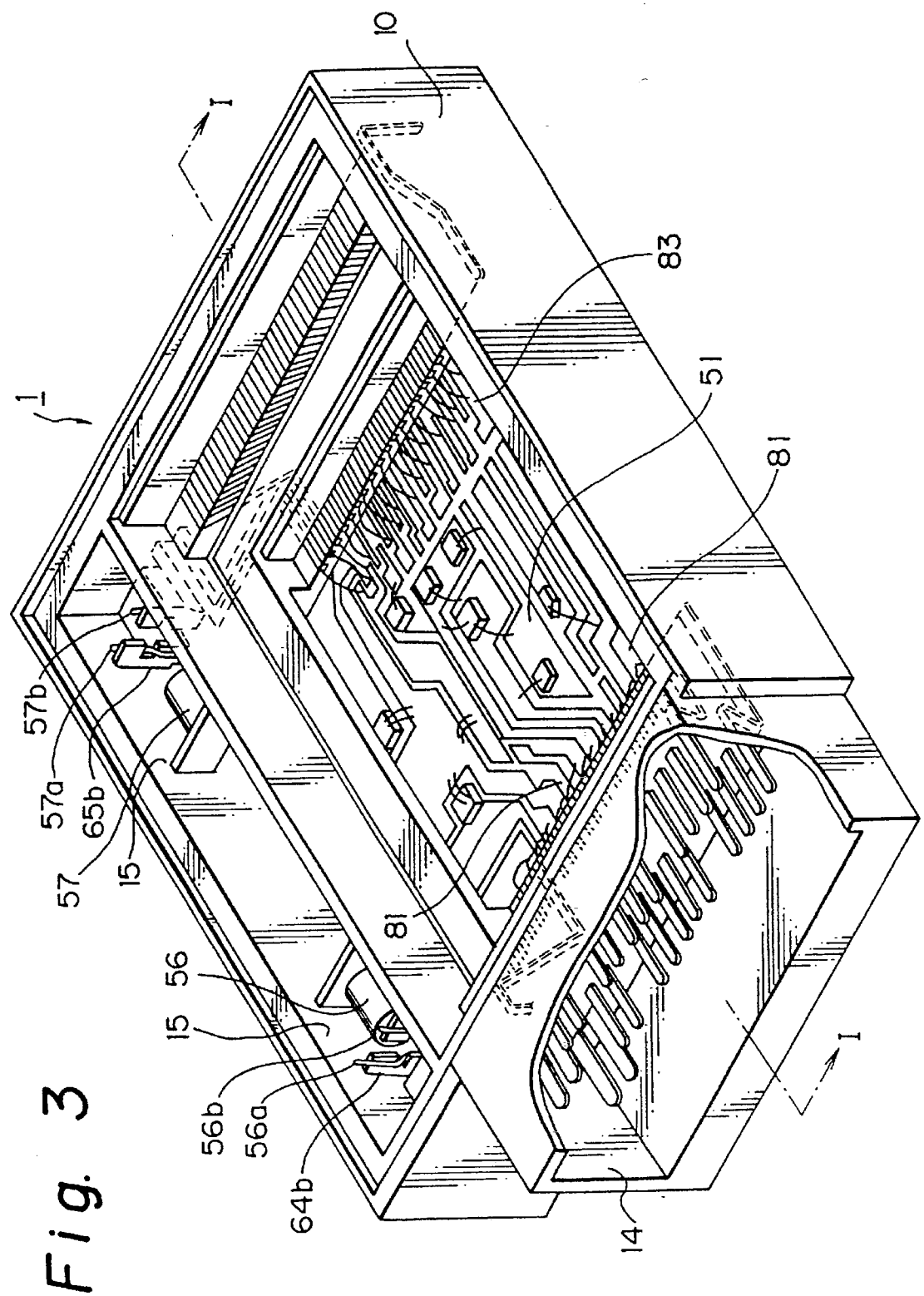
FIG. 3 is a perspective view of the frame, in which a first circuit board is mounted.
Figure 4:
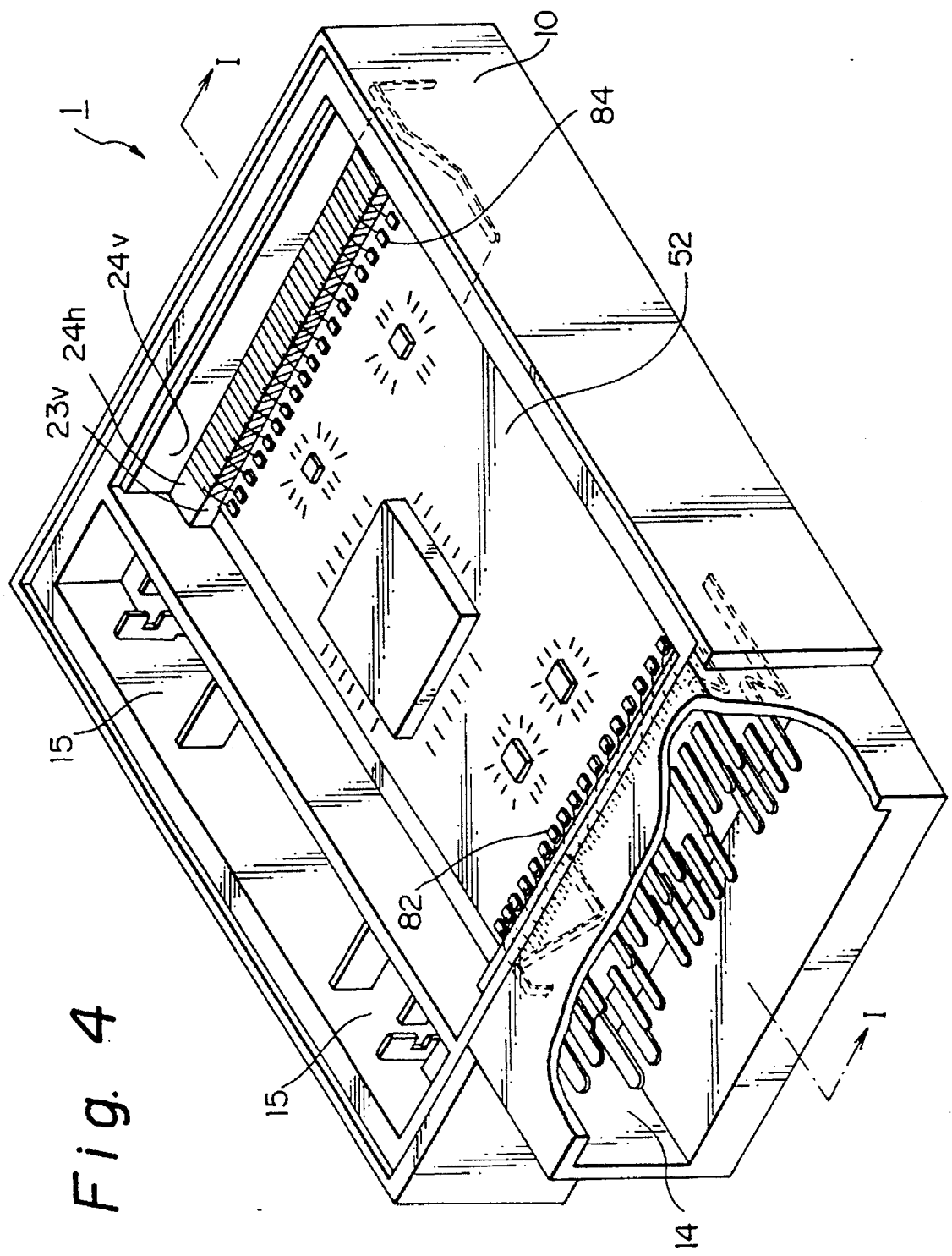
FIG. 4 is a perspective view of the frame, in which a second circuit board is mounted.
Figure 5:
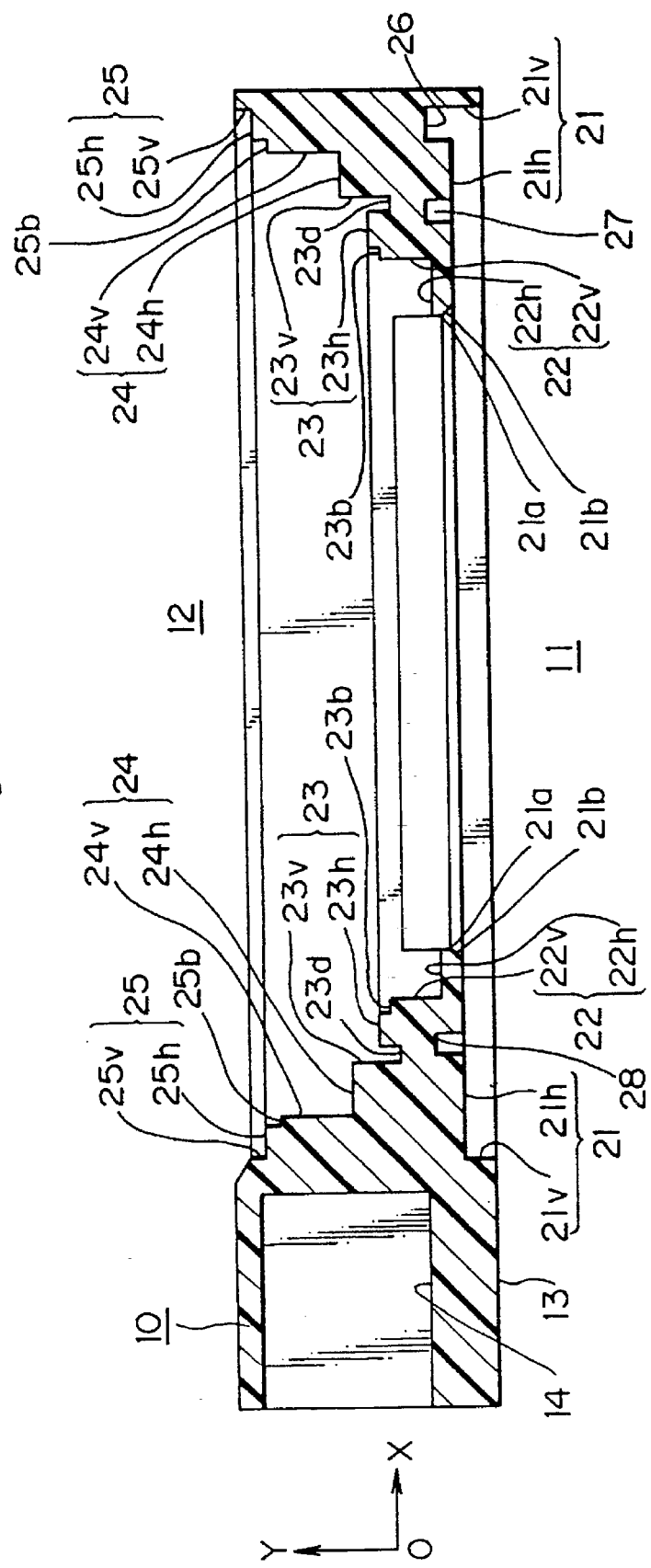
FIG. 5 is a section showing the construction of the frame.

In FIG. 1, there is illustrated one example of the basic construction of the electronic device according to the present invention. FIG. 2 is a perspective view of a frame 10. FIG. 3 is a perspective view of the device, in which a lower first circuit board 50 is mounted on the frame 10. FIG. 4 is a perspective view of the device, in which an intermediate second circuit board 52 is mounted on the frame 10. FIG. 5 is a section of the frame 10.

As shown in FIG. 1, the preferred embodiment of the electronic device includes a frame assembly 1 that defines openings 11 and 12 on major surfaces 100 and 200, and a plurality of circuit boards 50 and 52. On the circuit boards 50 and 52, any appropriate electronic circuits, such as a semiconductor integrated circuit or so forth, are mounted. The circuit boards 50 and 52 are disposed in the frame in a piling fashion orienting their board surface parallel to the major surfaces 100 and 200 of the frame assembly 1. First and second closure lids 40 and 46 are provided for closing the openings 11 and 12 defined in respective major surfaces 100 and 200. At least one of the circuit boards 50 and 52 have a surface on which no electronic circuit is formed; the surface which is placed in contact with the first closure lid 40. In the shown embodiment, the circuit board 50 is provided with such a surface in contact with the first closure lid 40.

Preferably, the first closure lid, to which the circuit board 50 is connected by contacting the surface having no electronic circuit thereto, is formed from a metal plate. Another circuit board 52, which is placed away from the first closure lid 40, also has a surface on which no electronic circuit is formed. Such a circuit board surface 52 is preferably connected to an appropriate support plate 43. The support plate 43 is preferably formed from a metal plate.

In the preferred construction, the second closure lid 46 is formed of the same metallic material as that of the first closure lid 40.

In the shown construction, the first closure lid 40 serves to radiate heat generated in the electronic circuits on the circuit board 50.

The first aspect of the electronic device according to the present invention for achieving the first object of the invention will be discussed in detail with reference to FIG. 5.

As best shown in FIG. 5, a frame 10 is formed of a synthetic resin into a parallelepiped configuration. In the shown condition, the frame 10 defines an upper opening 12 opening to the external space at the upper side and a lower opening 11 opening to the external space at the lower side. On the inside surface of the frame 10, a first stepped portion 21, a second stepped portion 22, a third stepped portion 23, a fourth stepped portion 24 and a fifth stepped portion 25 are formed in order from the lower side. Respective stepped portions 21, 22, 23, 24 and 25 are defined by horizontal planes 21h, 22h, 23h, 24h and 25h having normals oriented in a Y axis direction (vertical axis direction) and vertical planes 21v, 22v, 23v, 24v and 25v having normals oriented in a X axis direction (horizontal axis direction). It should be noted that the vertical plane as used in the disclosure is not necessarily limited to the exactly vertical plane but can include a plane oblique to the vertical or horizontal plane.

Figure 6:
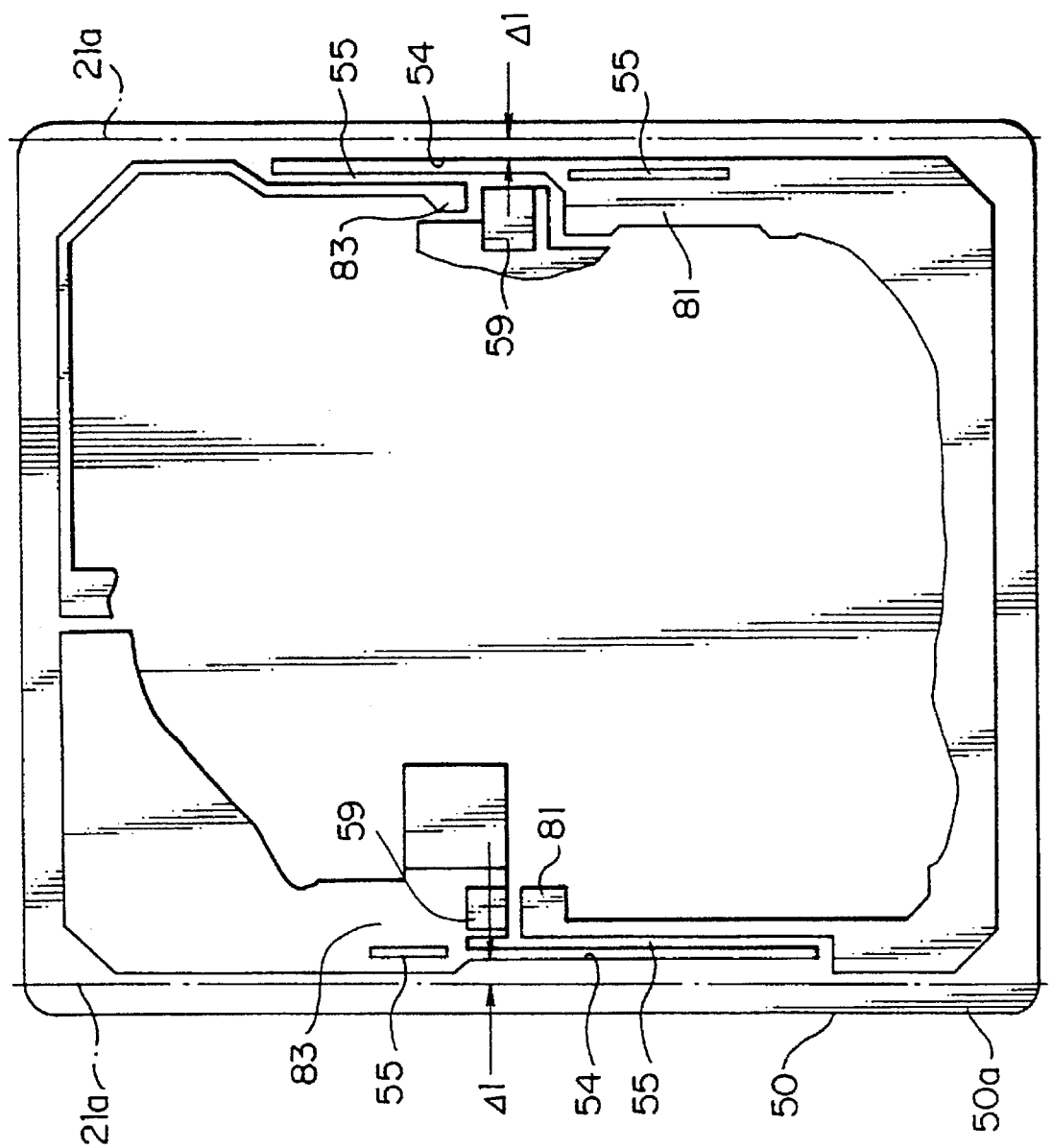
FIG. 6 is a plan view showing the first circuit board.

As shown in FIG. 6, the first circuit board 50 is fabricated by forming an insulation layer on a metal plate, for example an aluminum plate, which forms first closure lid 40 and forming a circuit pattern on the surface of the insulation layer. The circuit board integrally formed on the metal plate 40 is generally called a metal substrate. By bonding the peripheral portion 50a (FIG. 6) of the first circuit board 50 onto the horizontal plane 21h of the first stepped portion 21, the lower opening 11 is closed by the metal plate 40.

It should be noted that the height of the vertical plane 21v of the first stepped portion 21 is substantially equal to the thickness of the metal substrate on which the first circuit board 50 is integrally formed so that the bottom of the frame 10 and the back surface 41 of the metal plate 40 lie flush on a common plane.

On the first circuit board 50, a power supply circuit 51 (first electronic circuit) composed of power elements, such as power MOS transistor, power transistor and so forth, handling a large current and thus having a large amount of heat generation is mounted, as shown in FIGS. 1 and 3.

Figure 19:
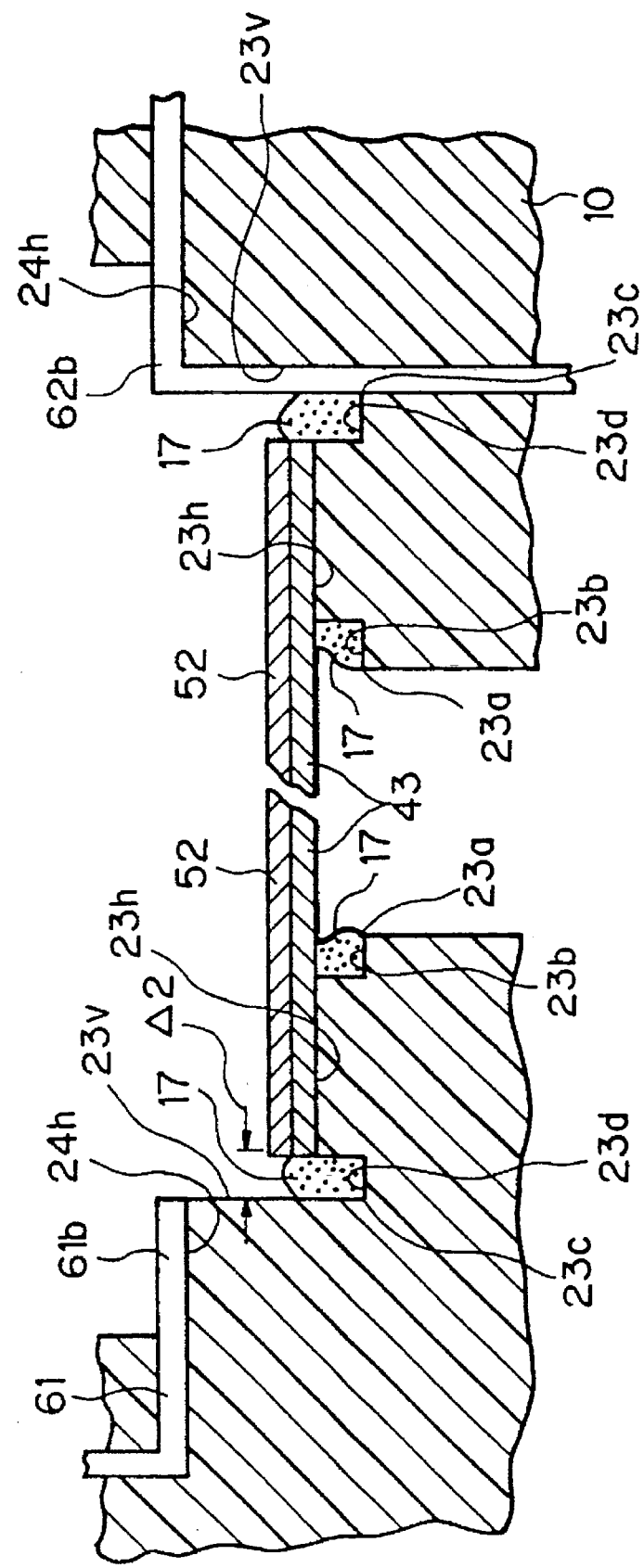
FIG. 19 is a section showing a detailed construction of a third step portion.

As shown in FIG. 1 and 19, the metal reinforcing plate 43 is arranged on the third stepped portion 23. Namely, on the horizontal plane 23h of the third stepped portion 23, the peripheral portion of the back side 44 of the metal reinforcing plate 43 is bonded by an adhesive. The second circuit board 52 is bonded on the surface 45 of the metal reinforcing plate 43 by the adhesive. On the second circuit board 52, a control circuit (second electronic circuit) handling a relatively small current and thus having a relatively small amount of heat generation is mounted. The power supply circuit 51 and control circuit 53 are coated by silicon gel 16, as shown in FIG. 1. The coating gel material to be employed for coating the circuits is not limited to silicon but can be any appropriate resin.

Since such a gel has an adiabatic effect, if the element handling a large current is mounted on the second circuit board in the foregoing construction, the heat generated by such an element may accumulate in a space defined between the first and second circuit boards 50 and 52 and cannot escape externally. In contrast to this, according to the shown construction of the present invention, the heat generated by the elements formed on the first circuit board 50 can be externally radiated through the metal plate 40 having a high heat radiation effect. In the shown construction, since the elements arranged on the second circuit board 52 will not generate a large amount of heat, no substantial heat will accumulate within the device.

On the fifth stepped portion 25 of the frame 10, a metal plate (closure lid member) 46 is provided for closing the upper opening 12. Namely, on the horizontal plane 25h of the fifth stepped portion 25, the peripheral portion of the back side 47 of the metal plate 46 is bonded by the adhesive. The surface of the metal plate 46 is exposed to the atmosphere. As set forth above, a casing of the electronic device 1 is formed by the frame 10 and the metal plates 40 and 46.

Since the shown embodiment of the electronic device is provided with the metal plate 40 made of aluminum for closing the lower opening 11 of the resin frame 10, the intermediate metal reinforcing plate 43 formed of aluminum in the frame 10, on which the second circuit board 52 made of a ceramic is provided, deflection owing to a difference of the thermal expansion coefficients between the resin frame 10 and the metal plate can be successfully prevented even at substantially high temperatures such as in the engine compartment of an automotive vehicle. Therefore, degradation of reliability because of cracking of the ceramic second circuit board 52 or a connection failure at a connecting portion on the second circuit board 52 can be successfully avoided. Also, since the metal plate 46 formed of aluminum is provided for the upper ending 12 of the frame 10, deflection of the frame and a connection failure of the circuit board associated with the deflection of the frame can be prevented with greater certainty.

It should be noted that the electronic device illustrated in FIG. 1 of Japanese Unexamined Patent Publication No. 1-147850 has a resin frame and a metallic closure lid member. The shown construction may cause deflection of the frame owing to a difference in the thermal expansion coefficient between the resin and the metal thereby causing cracking of the ceramic substrate disposed within the frame or degradation of reliability owing to a failure at the connecting portion.

In contrast to this, according to the shown embodiment, the first electronic circuit handling a relatively large current to generate a relatively large amount of heat is mounted on the lower metal plate board, and the second electronic circuit handling a relatively smaller current to generate a small amount of heat is mounted at the intermediate position. Also, the first circuit board is formed on the metal plate closing one opening of the resin frame. Therefore, the large amount of heat generated by the first electronic circuits is radiated externally through the metal plate. On the other hand, since the amount of heat generated by the second electronic circuit is small, sufficient heat radiation effect can be obtained even when the heat is radiated internally and by heat radiation to the second circuit board and the frame.

In the above-mentioned embodiment, discussion is provided for the example, in which two electronic circuit boards are employed. However, the present invention is equally applicable for any multi-board structure, such as those employing three or more boards.

Next, discussion will be provided for the second embodiment of the electronic device suitable for achieving the second object of the present invention.

The second embodiment of the electronic device according to the present invention has the construction as set out below.

The second embodiment of the electronic device comprises a resin frame forming a casing, first and second circuit boards disposed in a mutually parallel relationship within the frame and forming the circuit boards of the device, first and second lead pins having a multi pin structure extending from the inside to the outside through the frame and connected with the first and second circuit boards at respective inner ends, connecting member maintained at the inside of the side wall of the frame at the side opposite the side where the first and second lead pins are arranged in a stepwise bent fashion, first connecting portion arranged and exposed to the horizontal surface of the stepped portion formed in stepwise fashion at the inside of the side wall of the frame and electrically connected to the connecting portion of the first circuit board and second connecting portion arranged and exposed to the horizontal plane of another stepped portion formed on the side wall and electrically connected to the connecting portion of the second circuit board.

In the shown embodiment of the invention, the first and second circuit boards arranged in two stages within the frame are electrically connected by the first and second lead pins, through which inputting of the external signal and outputting the signal to the external circuit are performed.

On the other hand, in the frame, at the side opposite the side where the first and second lead pins are provided, an intermediate connecting lead, bent in a stepwise structure to act as the intermediate connecting member, is buried. The intermediate connecting member has the first connecting portion, the intermediate connecting portion and the second connecting portion. The intermediate connecting member is formed inside of the frame to define the stepwise stepped portion. The intermediate connecting member is so arranged that the horizontal plane of one of the stepped portions is exposed to the first connecting portion and the horizontal plane of another stepped portion is exposed to the second connecting portion. The intermediate connecting member is buried within the frame. The second connecting portion establishes an electrical connection with the connecting portion of the second circuit board.

At one side of the frame and with the intermediate connection lead, i.e. the intermediate connection member buried in the frame, an electrical connection between the first and second circuit boards can be facilitated.

The practical embodiment of the abovementioned second embodiment will be discussed herebelow with reference to FIGS. 7 to 12.

Figure 7:
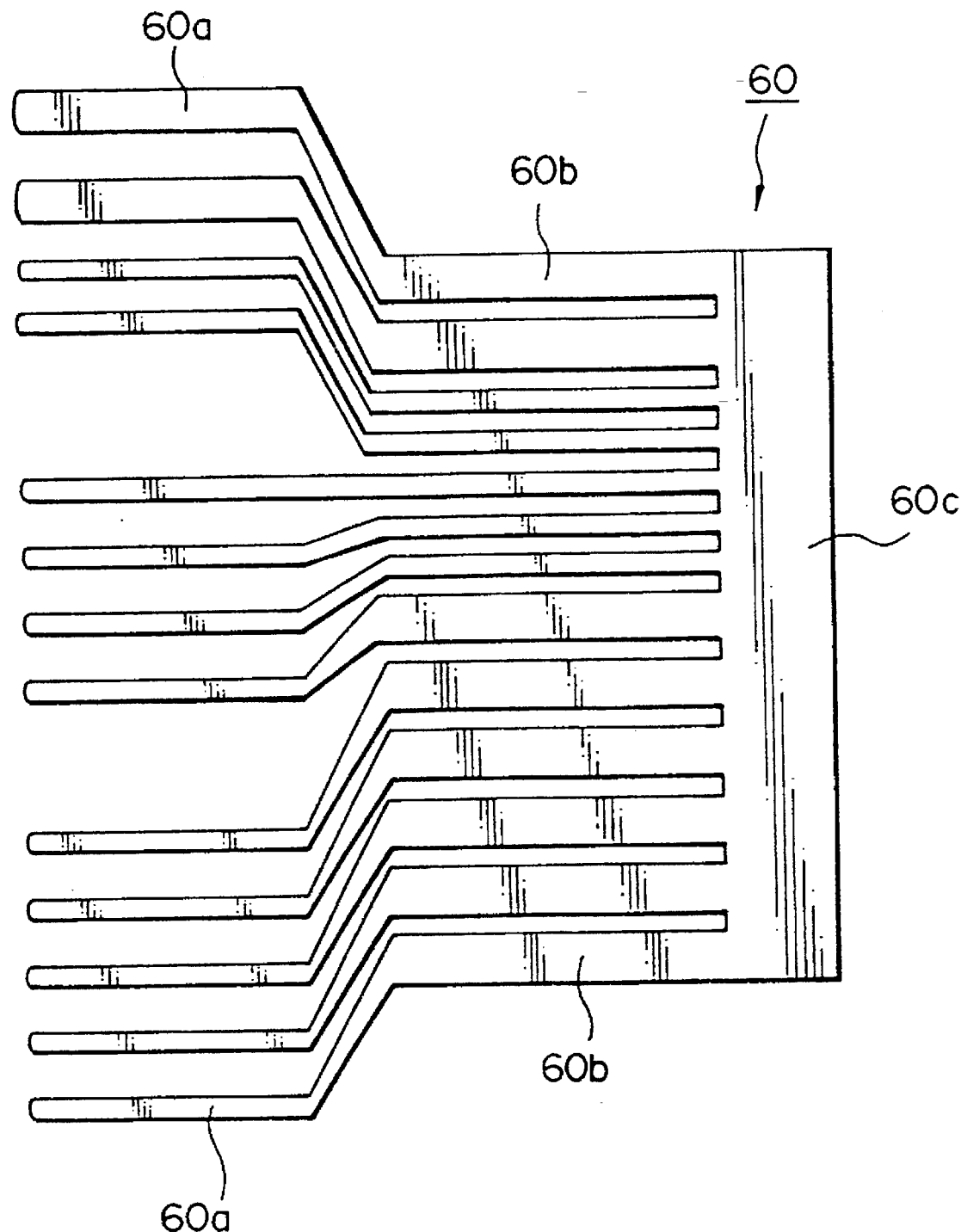
FIG. 7 is a plan view showing a flat configuration before bending of lead pins.
Figure 8:
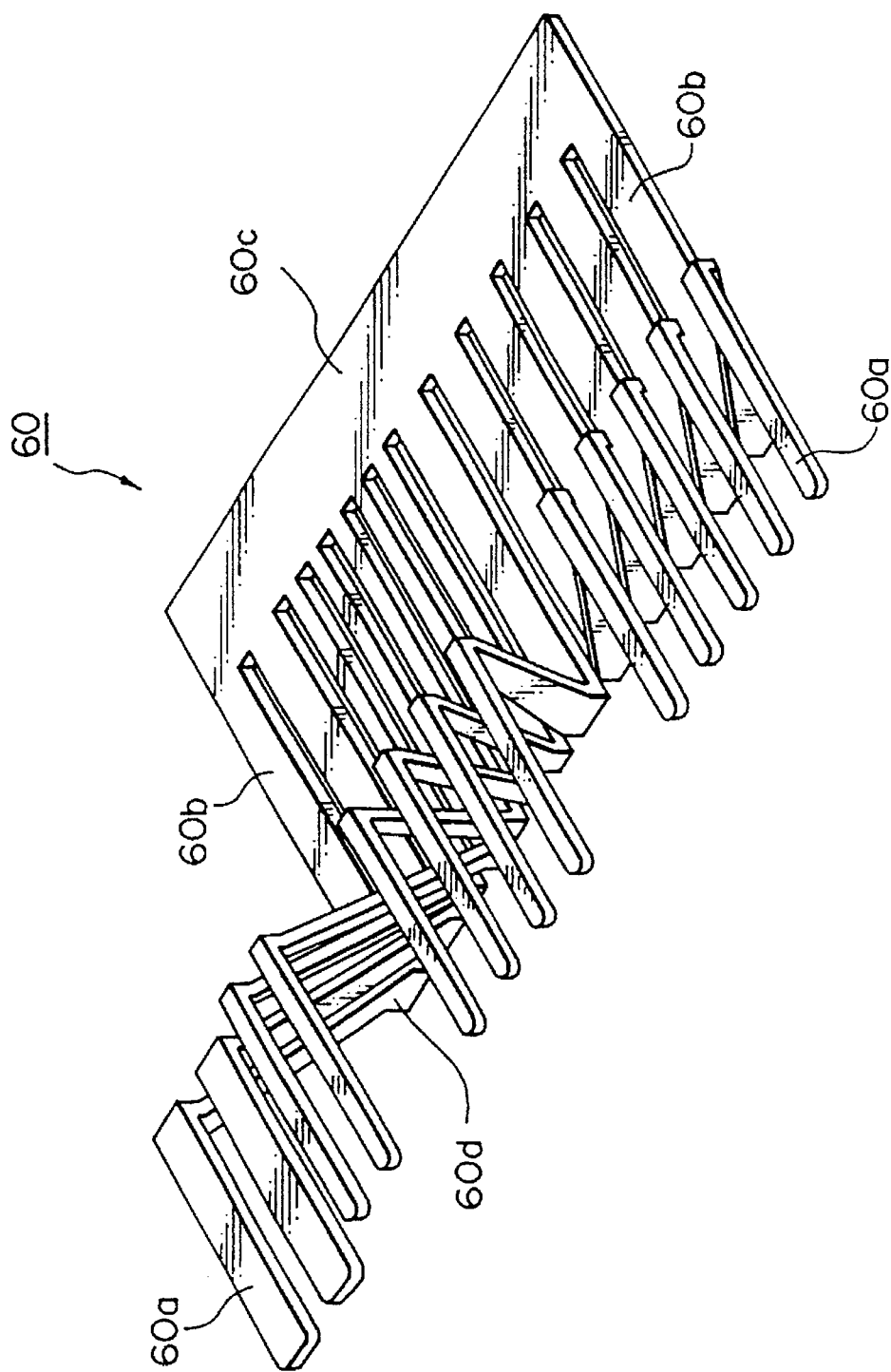
FIG. 8 is a perspective view showing a three dimensional configuration after a bending process of the lead pins of FIG. 7.

In the frame 10, a connector casing 14 is formed at one side. Within the connector casing 14, first and second lead pins 60 and 61 are extended. The lead pin 60 is formed by bending the metal plate formed with a plurality of leads in a substantially comb like configuration as shown in FIG. 7, into the configuration as illustrated in FIG. 8. The lead pin 60 is buried in the frame 10 by insert molding. As shown in FIG. 1, pins 60a are formed at one end of the lead pin 60. The pins 60a extend into the internal space of the connector casing 14. A bonding portion 60b formed at the other end of the lead pin 60 is provided in the position exposed on the horizontal surface 22h of the second stepped portion 22. This bonding portion 60b is electrically connected to a bonding portion 81 of the wiring pattern in the first circuit board 50 by wire bonding.

Figure 9:
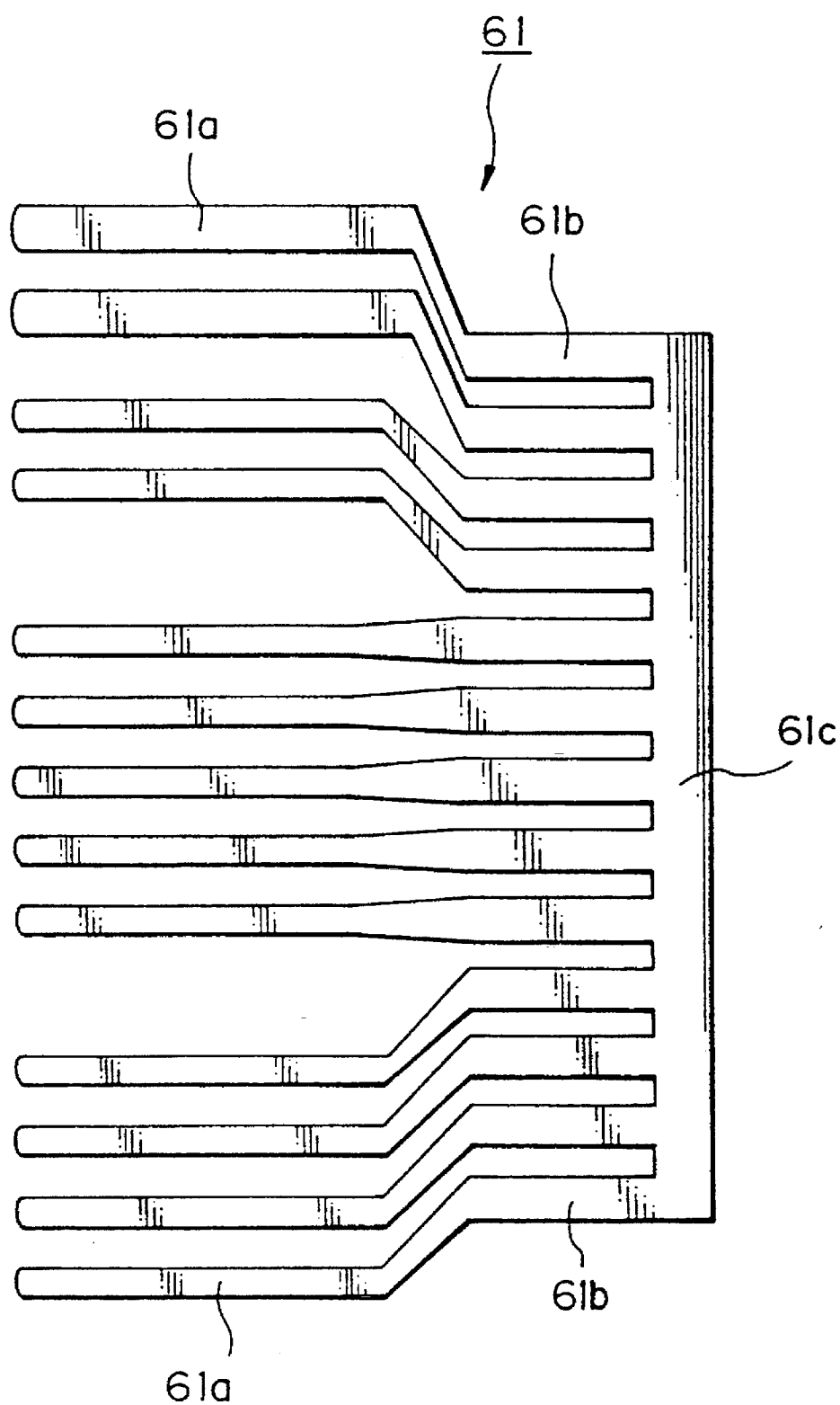
FIG. 9 is a plan view showing another flat configuration before bending of the lead pin.
Figure 10:
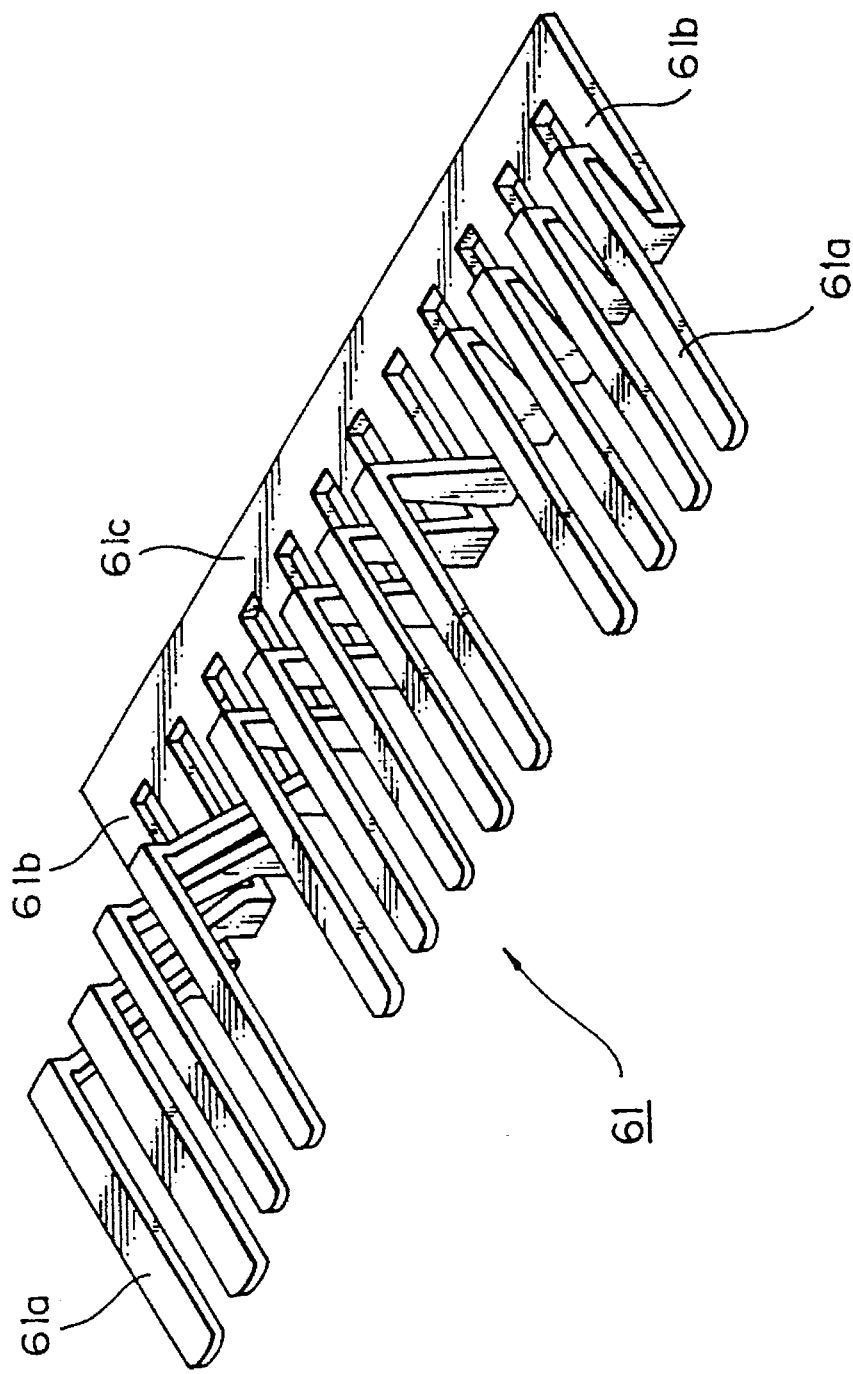
FIG. 10 is a perspective view showing a three dimensional configuration after bending the lead pins of FIG. 9.

Similarly to the lead pin 60, the lead pin 61 is formed by bending the metal plate in the configuration illustrated in FIG. 9 into the configuration illustrated in FIG. 10. The lead pin 61 is also buried in the frame 10 by insert molding. Pins 61a formed at one end of the lead pin 61 extend into the internal space of the connector casing 14. A bonding portion 61b formed at the other end of the lead pin 61 is arranged to be exposed on the horizontal plane 24h of the fourth stepped portion 24. The bonding portion 61b is electrically connected to a bonding portion 82 of the wiring pattern on the second circuit board 52 by the wire bonding.

It should be noted that in the lead pins 60 and 61, frame portions 60c and 61c commonly holding respective leads are separated from each other by means of a cutter after resin molding so that each of the leads are electrically insulated from each other.

Figure 11:
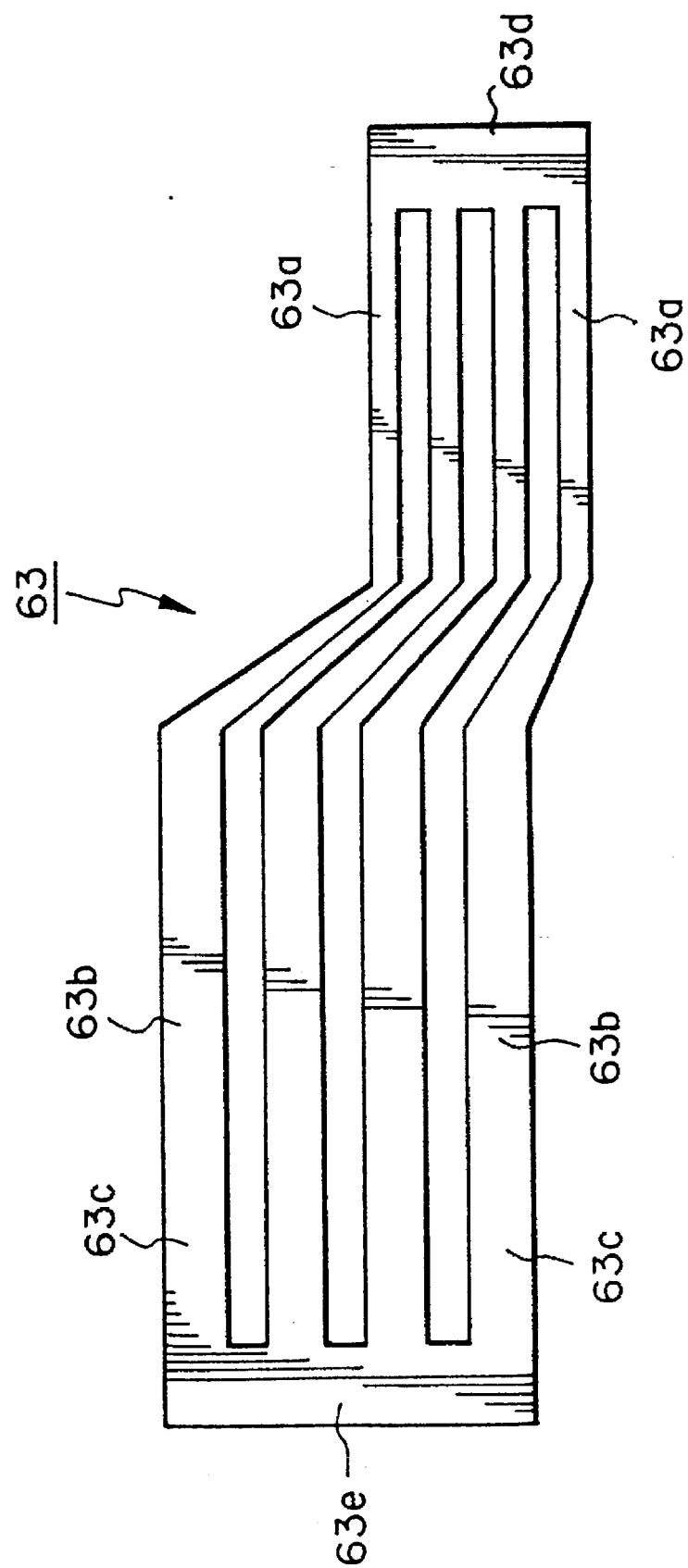
FIG. 11 is a plan view showing a flat configuration before bending the connection leads.
Figure 12:
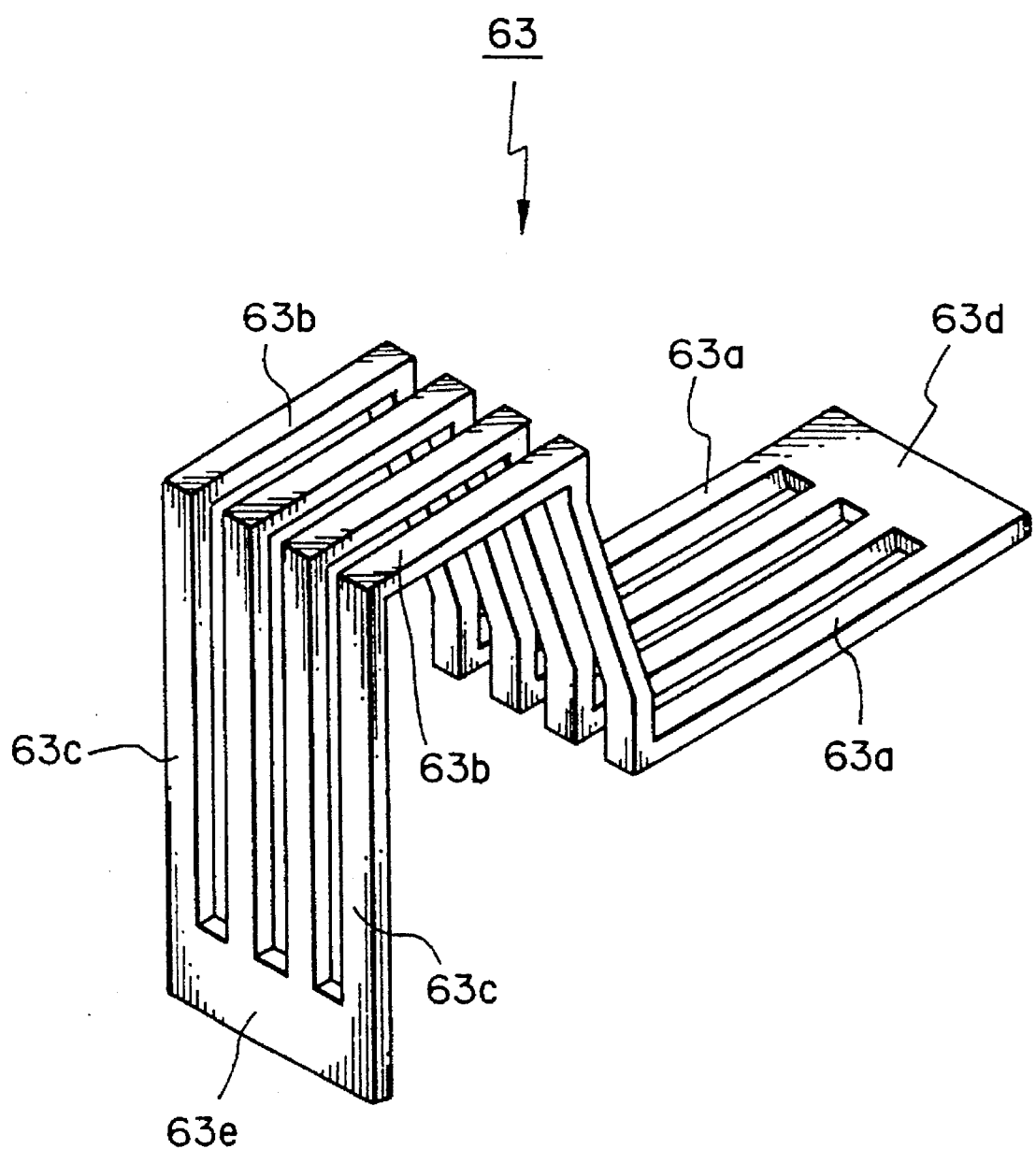
FIG. 12 is a perspective view showing a three dimensional configuration after bending the connection leads of FIG. 11.

On the other hand, a connection lead 63 that establishes only electric connection between the first and second circuit boards 50 and 52 and does not have an extending pin for externally feeding signals, is also buried in the frame by insert molding. The connection lead 63 is formed by bending the metal plate in the configuration as shown in FIG. 11 into the configuration as shown in FIG. 12. The connecting lead 63 has a bonding portion 63a exposed on the horizontal surface 22h of the second stepped portion 22 and a bonding portion 63b exposed on the horizontal surface 24h of the fourth stepped portion 24. The tip end 63c of the connection lead 63 is bent downward with respect to the frame 10. Frame portions 63d and 63e are bent after resin molding so as to insulate the respective leads to each other. The bonding portion 63a is electrically connected to the bonding portion 81 of the wiring pattern on the circuit board 50 by wire bonding. On the other hand, the bonding portion 63b is electrically connected to the bonding portion of the wiring pattern of the second circuit board 52 by wire bonding. With the connection lead 63, electrical connection of part of the wiring of the first and second circuit boards 50 and 52 is established. It should be noted that energy for the wire bonding may be ultra sonic wave energy.

In the shown embodiment of the electronic device according to the invention, one example of a process for fabricating the intermediate connection members 62 to 65 (i.e. connection leads) will be discussed herebelow.

Namely, basically, in the production process of the electronic device as set forth above, when the frame is molded by setting the connection lead as an insert, the connection leads are arranged on the surface that forms the cavity of the mold. A comb-shaped support plate extended toward inside of the cavity from the surface forms the cavity of the mold so as to engage with a plurality of metallic leads at the extended portions. When the connection lead is thus fixed in the cavity, molding of the frame is performed.

Figure 24:
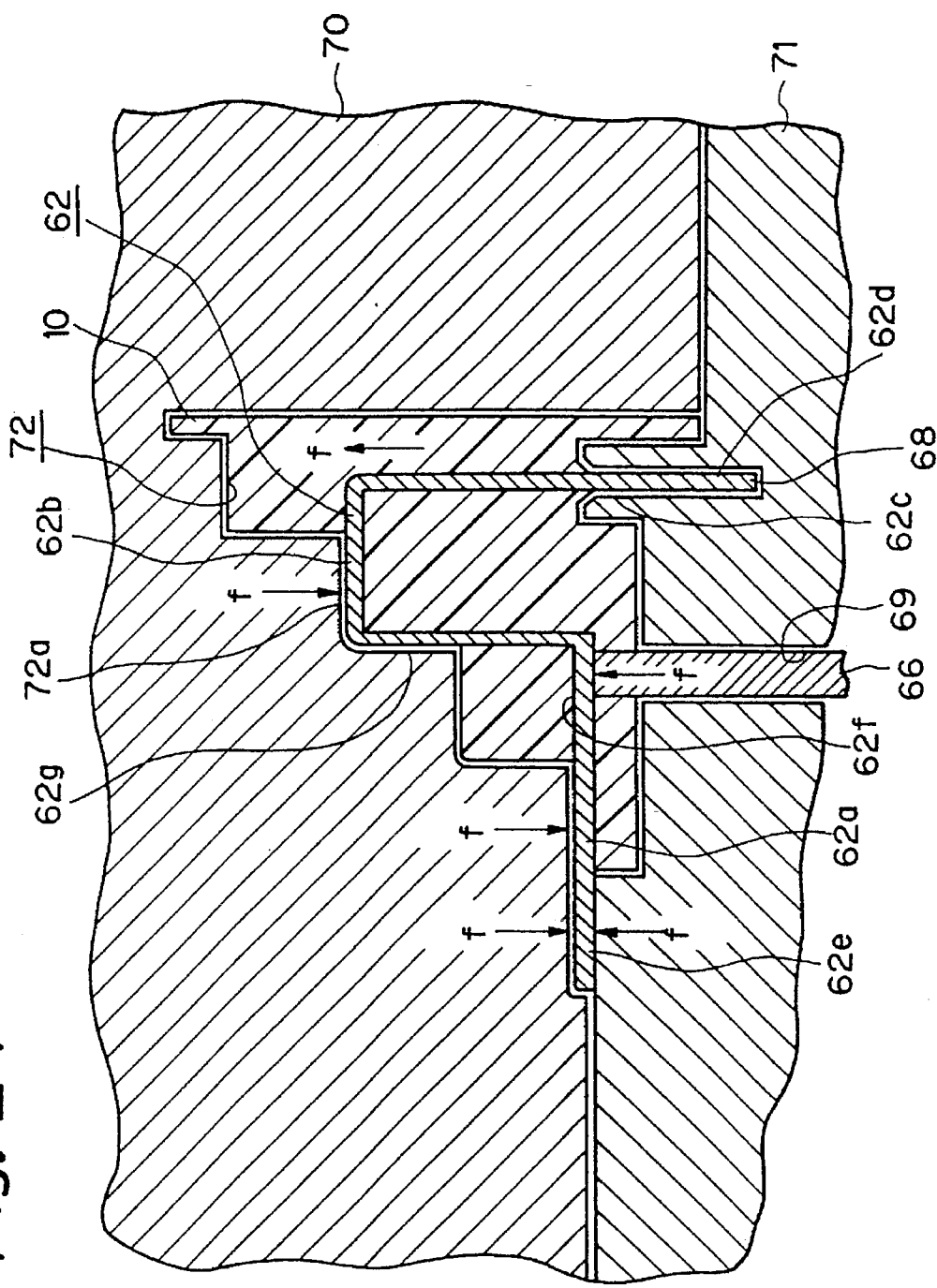
FIG. 24 is a section showing the relationship between a die associated with a production process of the frame and the connection lead.

Through the process set forth above, the frame 10 can be molded with the lead pins 60 and 61 and the connection leads 62, 63, 64 and 65 as inserts. As shown in FIG. 24, the mold principally comprises an upper mold 70, a lower mold 71 and a core (not shown). In order to inject molten resin between the upper and lower molds 70 and 71, a cavity 72 is defined. The lead pins 60 and 61 and the connection leads 63, 64 and 65 are supported on the core for forming the connector casing 14.

On the other hand, the connection lead 62 is arranged in the cavity 72 in the following manner. The tip end 62c and the frame portion 62d of the connection lead 62 are inserted into a groove 68 defined in the lower mold 71. The frame portion 62e is clamped between the upper and lower molds 70 and 71. The bonding portion 62b is contacted onto the cavity surface 72a of the upper mold 70. The intermediate connecting portion 62f and the intermediate connecting portion 62g extending from the bonding portion 62a are arranged in the cavity 72. The intermediate connecting portion 62f is supported by a comb-shaped support plate 66 extending from a groove 69 formed in the lower mold 71.

Figure 25:
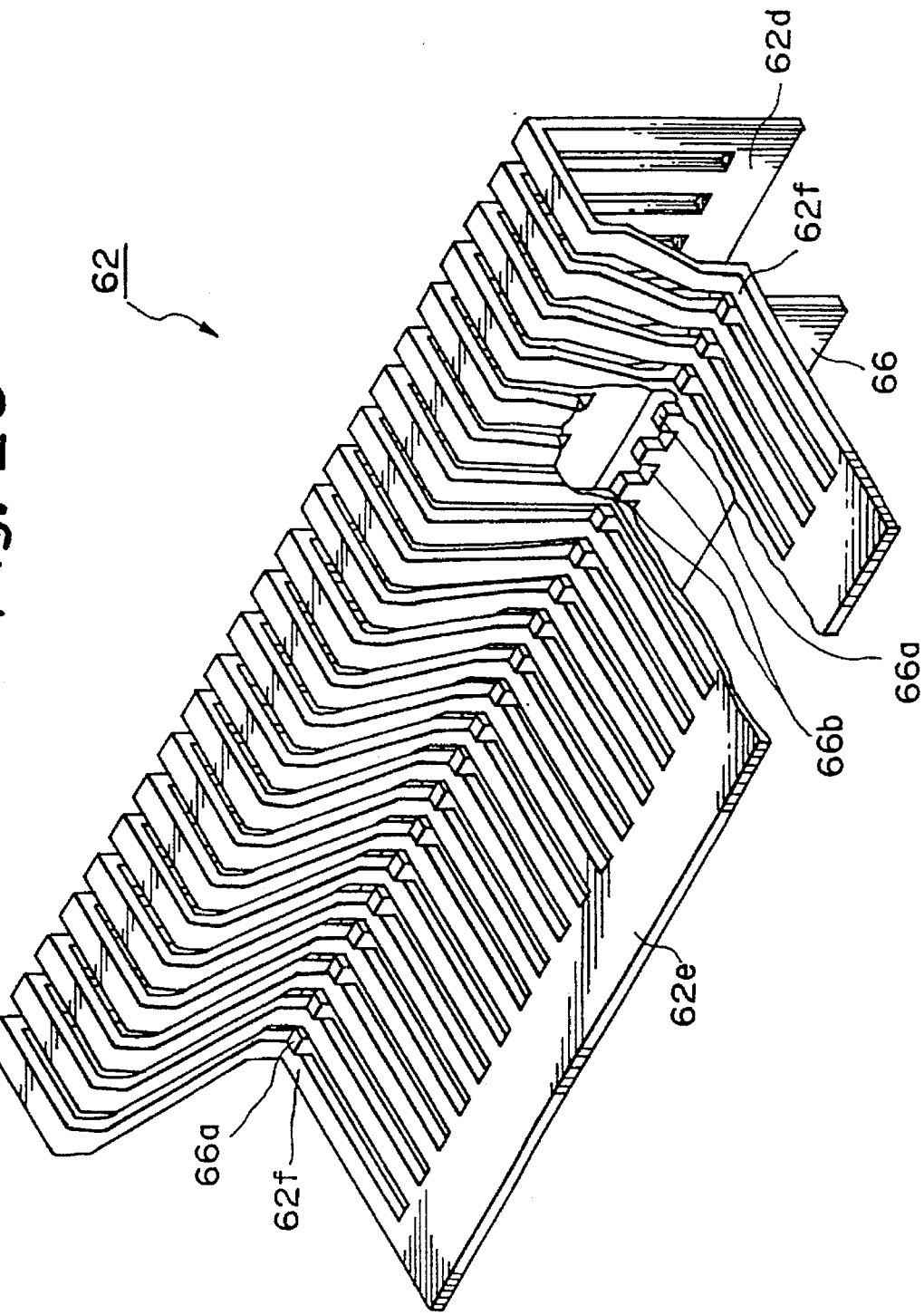
FIG. 25 is a perspective view showing a manner for supporting the connection lead during fabrication of the frame.

The manner of supporting the connection lead 62 by means of the supporting plate 66 is clearly illustrated in FIG. 25. Each leg 66a of the supporting plate 66 is inserted between the adjacent leads of the connection lead 62. Each lead of the connection lead 62 is depressed toward the upper mold by the root portion 66b of the support plate 66. As a result, each lead of the connection lead 62 can be properly maintained to prevent the respective leads from contacting with each other.

On the other hand, by the depression force (f) depressing the supporting plate 66 toward the upper mold 70, the bonding portions 62a and 62b receive a reacting force (f) directed from the upper mold 70 to the lower mold 71. As a result, the connection lead 62 is maintained with the appropriate attitude in the cavity 72. Thereafter, in the frame 10 following molding, the bonding portions 62a and 62b of the connection lead 62 are respectively situated to be exposed on the horizontal plane 22h of the second stepped portion 22 and the horizontal plane 24h of the fourth stepped portion 24. Therefore, a failure in molding can be successfully prevented.

It should be appreciated that when the connection lead 620 is simply formed into a U-shaped configuration, and since no intermediate connection portion (the portion corresponding to 62g of FIG. 24) such that the depression force (f) of the supporting plate 66 is not present, it becomes difficult to transmit the depression force (f) to the bonding portion 620b in contact with the upper mold 70. Therefore, the force to depress the bonding portion 620b toward the upper mold 70 becomes insufficient to possibly create a clearance between the bonding portion 620b and the upper mold. In such a case, the resin can be injected into this clearance so that the bonding portion 620b cannot be exposed. Furthermore, it is also possible to cause an inappropriate attitude of the bonding portion 620b so that the bonding portion 620b cannot be formed with a regular pitch.

Figure 16:
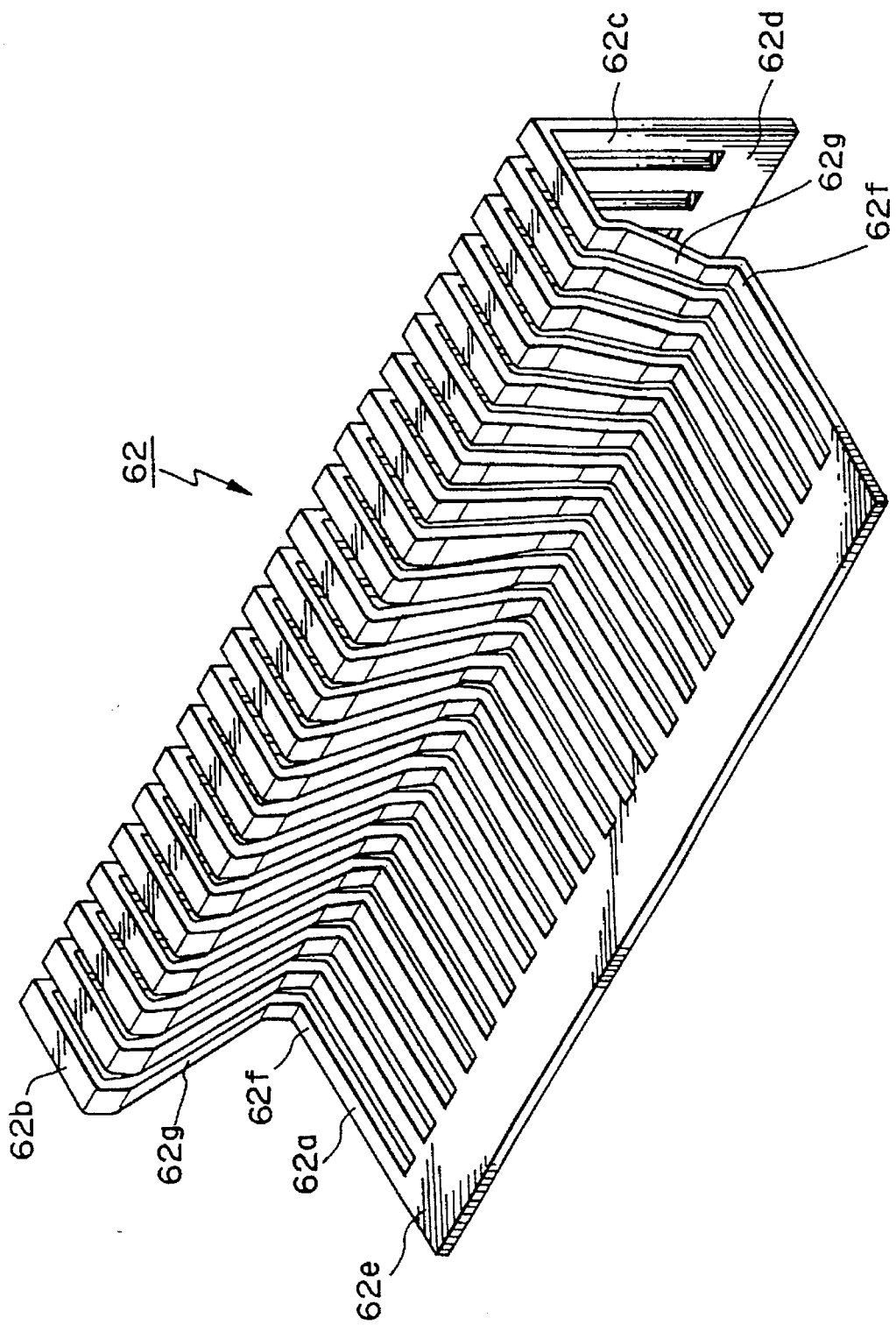
FIG. 16 is a perspective view showing a three dimensional configuration after bending the connection leads of FIG. 15.

However, by forming the connection lead 62 in the configurations as illustrated in FIGS. 16 and 25, the bonding portion 62b can be properly formed on the horizontal surface 24h of the fourth stepped portion 24 of the frame 10.

Figure 28C:
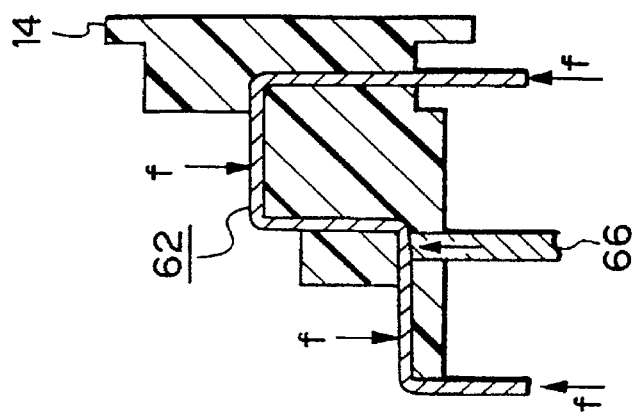
FIGS. 28(a)–(c) are cross sectional views showing a connection between a terminal portion of the connection lead and a lead.
Figure 28B:
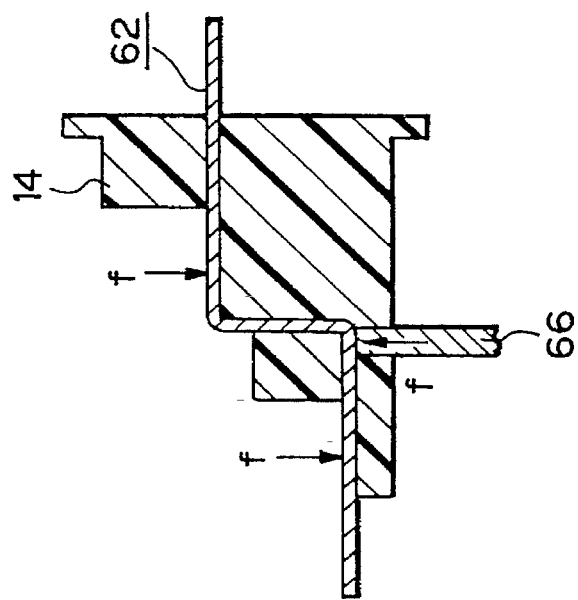
Figure 28A:
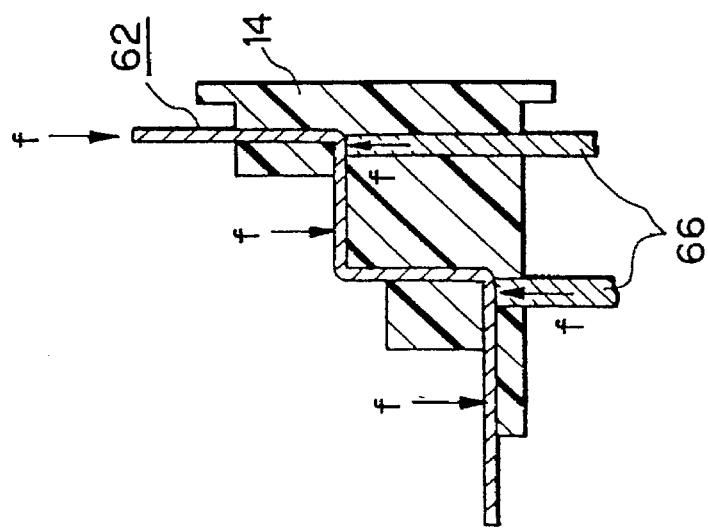

Since it is only required to properly apply the depression force (f) of the support plate 66 to the connection lead 62, the configuration of the connecting lead 62 and the position to apply the depression force by the supporting plate 66 can be modified as shown in FIGS. 28(a)–28(c).

On the other hand, after molding the frame 10, respective frame portions 60c, 61c, 62e, 62d, 63e, 63d and 64c of the lead pins 60 and 61, the connection leads 62, 63, 64 and 65 are cut away for insulating them from each other.

Namely, in the above-mentioned process of fabrication of the electronic device, the connection leads are arranged on the surface forming a cavity of the mold. Subsequently, the comb shaped plate extends toward the inside of the cavity from the surface forming the cavity in the mold. Then, by establishing engagement between the comb shaped support plate and the metallic lead, the connection lead can be depressed onto the cavity surface with the depression force of the support plate. By this depression force, the connection lead that is bent in a stepwise fashion can be arranged so as to leave no gap with the cavity surface and in the proper attitude. Under these conditions, the frame is molded.

Accordingly, the first and second contact portions of the connection lead are buried while leaving the surfaces exposed on respective stepped portions formed in the frame. As a result, the shown electronic device according to the invention can eliminate the possibility of an occurrence of production failure.

Next, another practical embodiment of the electronic device according to the present invention will be discussed. FIGS. 2 to 4 briefly show another embodiment of the electronic device according to the present invention.

At the side of the frame 10, a capacitor box 15 is formed, as shown in FIG. 2. Capacitors 56 and 57 are disposed within the capacitor box 15 in a horizontal fashion, as shown in FIG. 3. These capacitors 56 and 57 cannot be arranged on the first and second circuit boards 50 and 52 in view of the mounting space. By housing the capacitors 56 and 57 that have relatively large capacitances and large heights within the capacitor box 15, which is formed at the side of the frame, the overall packaging density of the electronic device 1 can be improved.

Figure 13:
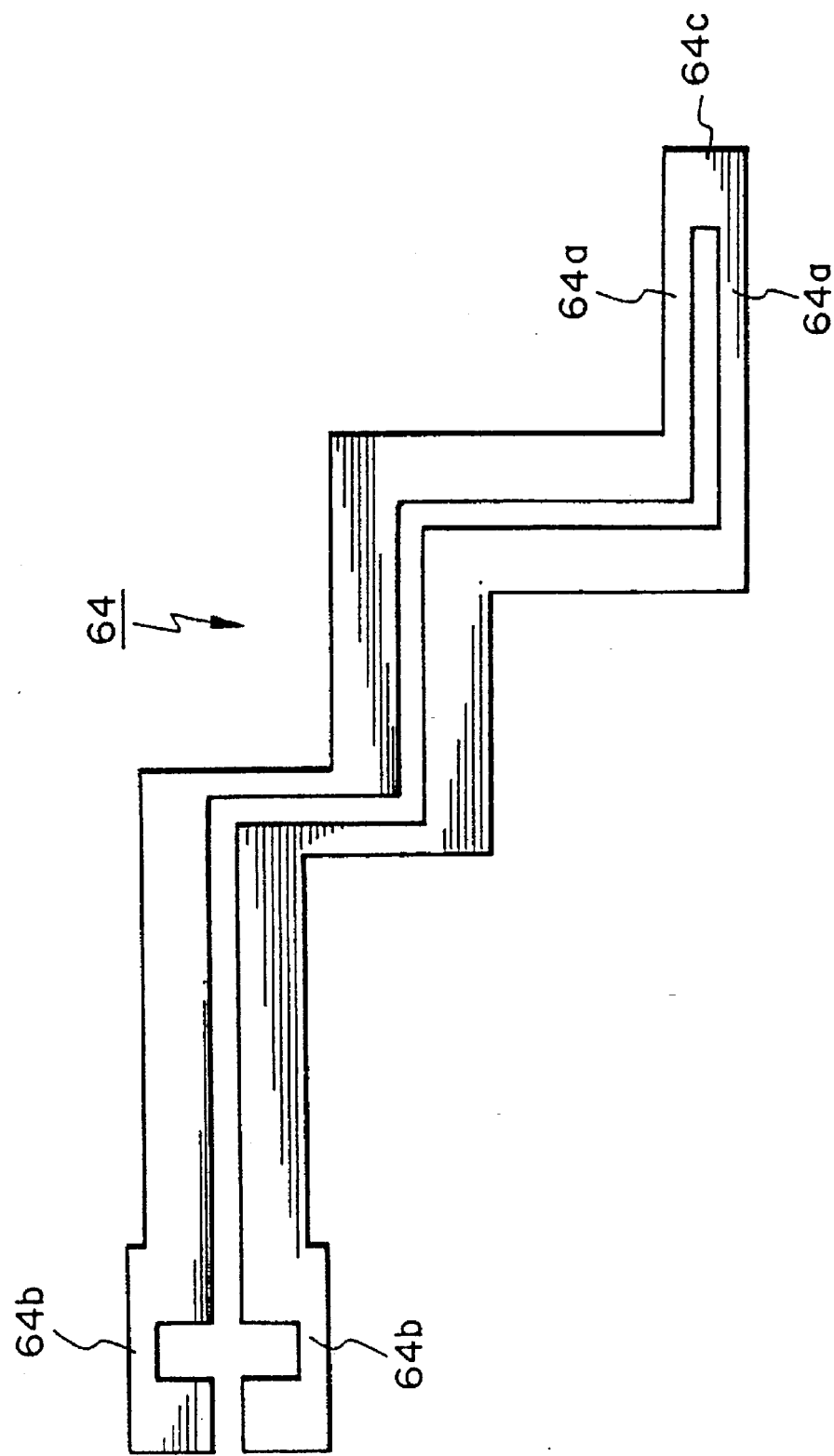
FIG. 13 is a plan view showing another flat configuration before bending the connection leads.

The connection lead 64 connected to the capacitor 56 is buried in the frame 10 by insert molding. The connection lead 64 is formed by bending the metal plate illustrated in FIG. 13 into the configuration illustrated in FIG. 14.

The connection lead 64 has a bonding portion 64a exposed on the horizontal surface 22h of the second stepped portion 22, a terminal portion 64b vertically extending within the capacitor box 15, and a frame portion 64c. The frame portion 64c is cut away after molding the frame 10. The bonding portion 64a is electrically connected to the wiring pattern of the first circuit board 50 by wire bonding. The terminal portion 64b is connected to the leads 56a and 56b of the capacitor 56 by way of electric welding.

Figure 15:
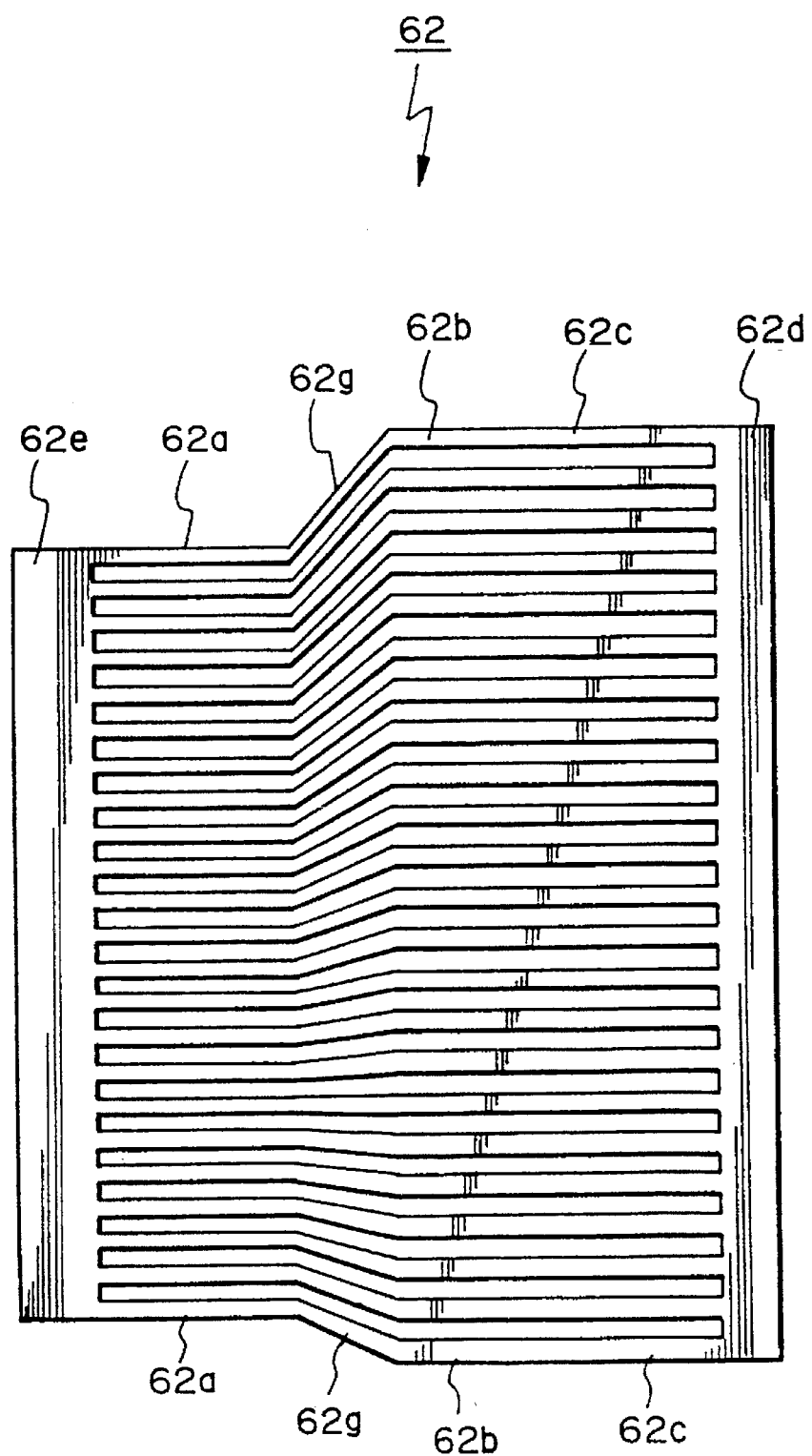
FIG. 15 is a plan view showing a further flat configuration before bending the connection lead.

On the other hand, at the side of the frame 10 opposite the side where the connector casing 14 is formed, the connecting lead 62 that is formed by bending the substantially comb-shaped metal plate illustrated in FIG. 15 at a substantially right angle to form the configuration illustrated in FIG. 16 (in the configuration defining substantially U-shaped configuration with transversely extending portion) is buried in the frame 10 by insert molding. The connection lead 62 has the bonding portion 62a formed at one end, which is exposed on the horizontal plane 22h of the second stepped portion 22. The connection lead 62 also has an intermediate portion 62g buried within the frame body. On the other hand, the bonding portion 62b of the connection lead 62b is exposed on the horizontal plane 24h of the fourth stepped portion 24. The tip end 64c at the other end is extended into a groove 26 formed on the horizontal plane 21h of the first stepped portion 21.

It should be noted that the frame portion 62d commonly holding respective leads extends into the groove 26 immediately after finishing the molding process. However, the frame portion 62d is then cut away. Similarly, the frame portion 62e is cut away after molding, and by this, respective leads are separated in a mutually insulated fashion. In order to facilitate cutting away of the frame portions 62d and 62e, a cut line may be preliminarily provided.

As shown in FIG. 1, the bonding portion 62a of the connection lead 62 and the bonding portion 83 of the wiring pattern of the first circuit board 50 are electrically connected to each other by wire bonding. Similarly, the bonding portion 62b of the connection lead 62 and the bonding portion of the wiring pattern of the second circuit board 52 are electrically connected by the wire bonding. Therefore, by employing the connection lead 62, the first and second circuit boards 50 and 52 are electrically connected.

Figure 14:
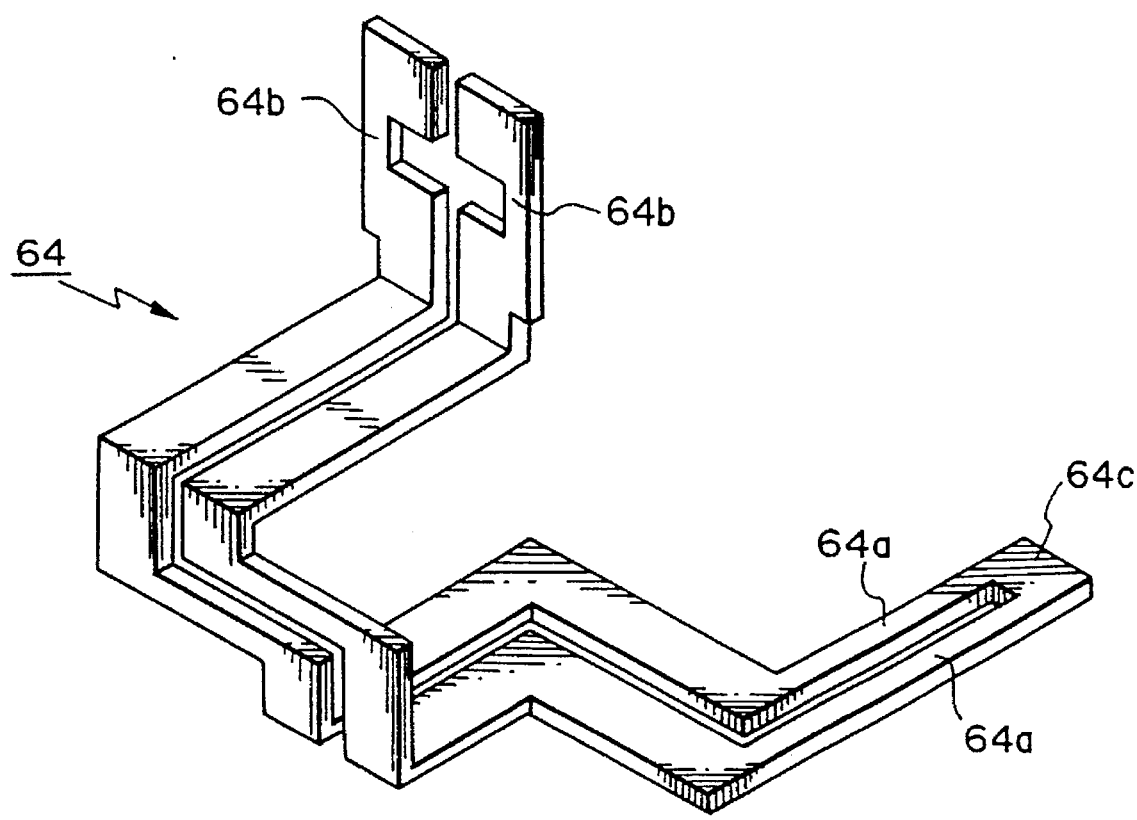
FIG. 14 is a perspective view showing a three dimensional configuration after bending the connection leads of FIG. 13.

Furthermore, at the side of the frame where the connection lead 62 is arranged, the connection lead 65 having substantially the same configuration as the connection lead 64 illustrated in FIG. 14 is buried in the frame 10. The connection lead 65 has the bonding portion 65a exposed on the horizontal plane 22h of the second stepped portion 22, and a terminal portion 65b vertically extending into the capacitor box 15. The bonding portion 65a and the wiring pattern of the first circuit board 50 are electrically connected by the wire bonding. The terminal portion 65b is connected to the lead 57b of the capacitor 57 by way of electric welding.

Next, discussion will be provided for the construction of the circuit board 50 in an electronic device according to the present invention.

On the first circuit board 50, a circuit wiring corresponding to the power supply circuit 51 illustrated in FIG. 3, is provided. When the first circuit board 50 is mounted on the first stepped portion 21, a dummy wiring 54 having a projection is formed at a position spaced from the inner boundary 21a of the horizontal plane 21h of the first stepped portion as illustrated in FIGS. 5 and 6, by Δ1. On the other hand, at the inside of the dummy wiring 54, a recessed portion 55, to which no wiring is provided, is formed.

The dummy wiring 54 and the recess 55 function as follows.

When the first circuit board 50 formed on the metal plate 40 is mounted on the horizontal plane 21h of the first stepped portion 21 by the adhesive, the excess amount of adhesive tends to flow across the boundary 21a of the horizontal plane 21h into the first circuit board 50 to adhere on the connecting portion 59 of integrated circuits 58 mounted on the first circuit board, or causes abnormal conditions in the bonding capacity during bonding thereby causing degradation of reliability of the bonding. On the other hand, the excess amount of adhesive, can adhere on the bonding portions 81 and 83 of the circuit wiring which caused bonding failure.

Figure 17:
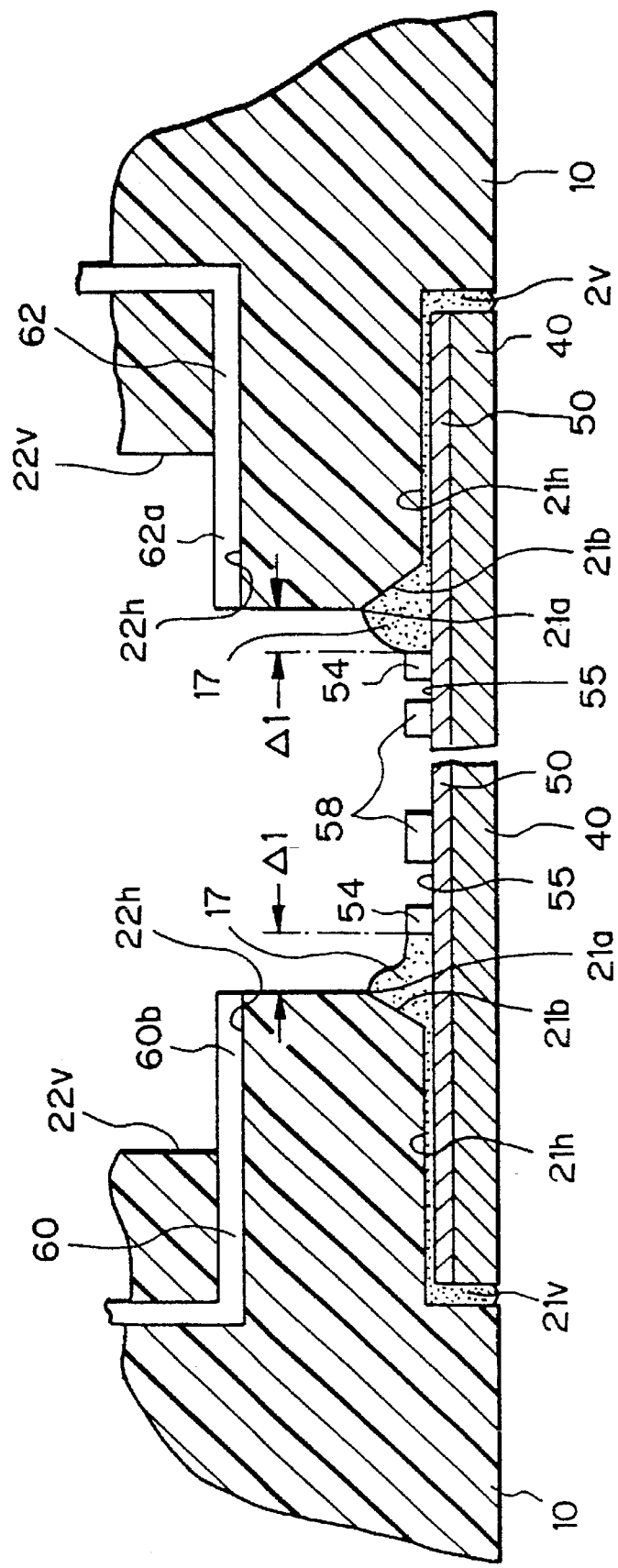
FIG. 17 is a section showing a detailed construction of a first step portion.

At this time, as shown in FIG. 17, the dummy wiring 54 formed on the first circuit board 50 blocks the flow of adhesive which caused the problems set forth above. Namely, the excess amount of adhesive 17 is accumulated within a small clearance Δ1 between the boundary 21a of the horizontal plane 21h and the dummy wiring 54. In addition, even when an amount of the adhesive flows over the dummy wiring to enter the first circuit board 50, such adhesive can be successfully trapped within the recessed portion 55 so that no adhesive may enter further inside the recessed portion 55. As a result, damage of the elements by the adhesive can be successfully prevented and a failure of wire bonding will not occur.

It should be noted that the dummy wiring is a wiring irrespective of the electric wiring or grounding line.

Next, several practical examples of the third embodiment of the electronic device according to the present invention will be discussed.

As the first example of the third embodiment, the electronic device, in which a plurality of circuit boards mounting electronic circuits are arranged in a multi-board structure, comprises a frame including a stepped inner wall having horizontal planes supporting peripheral portions of the circuit boards, vertical planes restricting the position of the circuit boards in the horizontal direction and extending from the horizontal planes; the circuit board having a size supported by the horizontal plane and forming a clearance with respect to the vertical plane, and a projection, projecting toward the clearance for contacting with the vertical plane or the peripheral edge of the circuit board, is formed on the peripheral edge of the circuit board or the vertical plane.

With such a construction, the circuit board is mounted on the stepped portion formed on the inner side wall of the frame in a stepwise fashion. The stepped portion is formed in a stepwise fashion to provide horizontal and vertical planes. The circuit boards are bonded onto the horizontal planes by the adhesive. The peripheral edge portion of the circuit board is arranged on the horizontal plane. The size of the circuit board is slightly smaller than the size defined by the vertical plane so that a clearance is defined between the peripheral edge of the circuit board and the vertical plane. At several positions on the peripheral edge of the circuit board, projections projecting into the clearance are formed. The tip end of the projections makes contact with the vertical plane. As an alternative, several projections projecting into the clearance are formed on the vertical plane, tip ends of which make contact with the peripheral edge of the circuit board.

Accordingly, when the circuit board is arranged on the stepped portion of the frame, between the peripheral edge of the circuit board and the vertical plane, the clearance is formed because of the presence of the projection. The back side of the peripheral portion of the circuit board is bonded to the horizontal plane by the adhesive, the excess amount of adhesive can be trapped within this clearance. Therefore, the excess amount of adhesive will never flow onto the circuit board. Also, a plurality of leads are formed on the frame in the vicinity of the circuit board for wiring connection with the circuit board. With the shown construction, the adhesive will never adhere on these leads. Accordingly, the adhesive will not adversely effect the electronic circuit mounted on the circuit board. Also, the adhesive will not adhere on the bonding portion of the lead and thus will never be a cause of connection failure.

In the second example of the third embodiment, the electronic device, in which a plurality of circuit boards with electronic circuits mounted thereon are arranged in a multi-board structure, has a stepped portion formed in stepwise fashion on the inner wall of the frame, which has horizontal planes for supporting the peripheral portion of the circuit board or closure lid of the casing, and grooves formed at the side of the inner boundary in the horizontal plane.

In the third and fourth examples of the third embodiment of the electronic device, in which the circuit boards mounting the electronic circuits are arranged in a multi-board structure, is provided with a stepped portion on the inner wall of the frame, the stepped portion of which being formed in a stepwise fashion with the horizontal planes for supporting the peripheral portion of the circuit board and the closure lid members of the casing and vertical planes defining a position to arrange the circuit board and the closure lid member of the casing in the horizontal direction and extending from the horizontal planes, and grooves formed in the vicinity of the boundary between the horizontal planes and the vertical planes.

Furthermore, according to the invention, in the electronic device having a multi-board structure of a plurality of circuit boards mounting electronic circuits and coated by a gel form coating agent, the inner wall of the frame is formed with stepped portions for restricting the upper surface of the coating agent that coats the circuit board.

Namely, with the above-mentioned construction, the circuit board and the closure lid are mounted on the stepped portion of the inner wall of the frame formed into a stepwise fashion. The stepped portion is formed into a stepwise fashion with horizontal planes to which the circuit board and the closure lid member are bonded by the adhesive. Since the grooves are formed on the horizontal plane at the inside of the boundary with respect to the space of the frame, the excess amount of adhesive provided between the circuit boards or the closure lids and the horizontal surfaces can be trapped within this groove. As a result, the excess amount of adhesive will never drip down to the lower circuit board or so forth.

Also, the stepped portion defined by the horizontal plane and the vertical plane is provided with a groove at the side of the boundary between the horizontal plane and the vertical plane. By this, when the circuit board is bonded onto the horizontal plane by bonding, the excess amount of adhesive is trapped in this groove. Therefore, the excess amount of adhesive will never flow up along the vertical plane.

In addition, since the stepped portion that defines the upper surface of the gel form coating agent, is formed on the inner wall of the frame, the coating agent is restricted to the upper surface by the surface tension thereof and will never leak upward.

Accordingly, the excessive amount of adhesive will not drip down to the lower side circuit board or climb up to the upper side circuit board to adversely effect the electronic circuit thereon. Therefore, an electrical connection failure otherwise caused by the dripping or climbing of the adhesive, can be successfully prevented.

Also, the gel form coating agent will not climb to the horizontal plane of the stepped portion for supporting other circuit boards and thus will never adhere on the connection lead, and a bonding failure or connection failure will not occur.

In addition, cracking or degradation of the heat radiation effect during to the difference of the thermal expansion coefficients and/or the viscosities of the circuit board and the adhesive, can be successfully prevented.

The fifth example of the third embodiment of the electronic device according to the invention includes a frame that defines the casing, and has an inner wall formed into a stepwise configuration that has horizontal portions in contact the peripheral portion of the wired surface of the circuit board and bonded there by the adhesive; the wired surface of the circuit board has a dummy wiring with a circuit pattern formed inside while maintaining a substantially small clearance relative to the inner boundary of the contacting region where it makes contact with the horizontal plane. In addition, a cut out is formed at the side of the inner boundary of the horizontal portion of the stepped portion.

In the construction set forth above, the wired surface of the circuit board is bonded with the horizontal plane of the stepped portion formed on the frame at the peripheral portion. At this time, the excess amount of adhesive can flow across the inner boundary of the contacting region of the circuit board mating with the horizontal plane of the stepped portion into the wired surface of the circuit board.

However, since the circuit board is formed with a dummy circuit and with the circuit pattern inside while leaving a substantially small clearance relative to the inner boundary, the excess amount of adhesive can be trapped within the small clearance between the inner boundary and the dummy wiring so that the adhesive is prevented from flowing beyond the dummy wiring. Accordingly, the electronic circuits mounted on the circuit boards will never be affected by such excess amount of adhesive. Also, in the shown embodiment, the adhesive will never adhere on the connecting portion to cause a connection failure. In addition, degradation of the heat radiation effect owing to the difference of the thermal expansion coefficients or viscosities between the circuit board and the adhesive can be prevented.

Furthermore, since the cut out is formed at the inner boundary of the horizontal plane, a clearance defined by the cut out and the circuit board may also serve to trap the excess amount of fuel.

Hereafter, the practical embodiments of the foregoing constructions of the electronic device will be discussed with reference to the drawings.

Figure 18A:
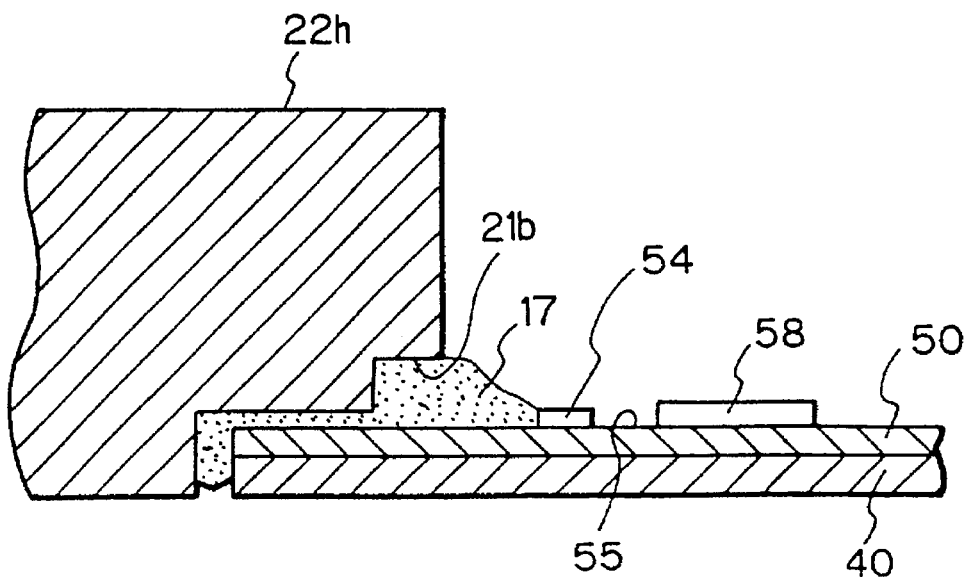
FIGS. 18a and 18b are sections showing the another detailed construction of the first step portion.
Figure 18B:
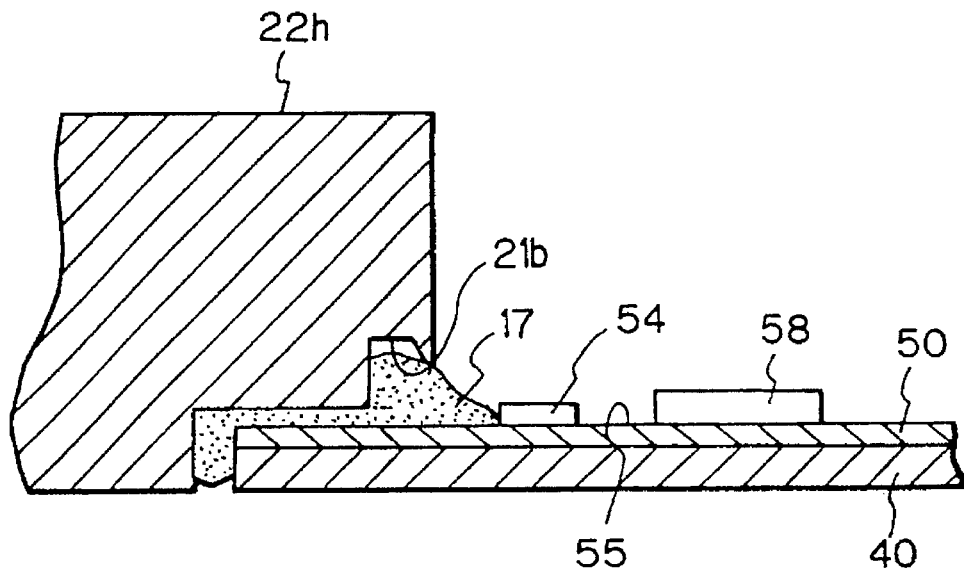

The first stepped portion 21 of the frame 10 in FIG. 5 is formed with cut-outs 21b at the inner boundary 21a of the horizontal surface 21h. As shown, the cut-out 21b can be formed obliquely. As an alternative, the cut-out 21b can be rectangular or essentially U-shaped configurations as illustrated in FIGS. 18(a) and 18(b).

The effect of the cut out is as follows.

When the first circuit board formed on the metal plate 40 is bonded onto the first stepped portion 21 by the adhesive, the excess amount of adhesive 17 is accumulated within a space defined by the cut-out 21b, the surface of the first circuit board 50 and the dummy wiring 54. As a result, the excess amount of adhesive 17 is prevented from flowing inside the first circuit board 50. Therefore, adverse effects of the adhesive to the integrated circuit 58 of the power supply circuit 51 can be successfully prevented.

On the other hand, the excess amount of adhesive 17 is prevented from swelling up to the horizontal plane 22h of the second stepped portion 22. Therefore, the bonding portion 60b of the lead pin 60, the bonding portion 63a of the connection lead 63, the bonding portion 64a of the connection lead 64, the bonding portion 62a of the connection lead 62 and the bonding portion 65a of the connection lead 65 are maintained free of the adhesive 17 so that a wire bonding failure will never occur.

In the third stepped portion 23 of the frame 10 illustrated in FIG. 5, groove 23b is formed at the inner boundary 23a of the horizontal plane 23h of the third stepped portion 23. Also, groove 23d is formed at the outer boundary 23c of the horizontal plane 23h. These grooves 23b and 23d may be configurations, other than a rectangular configuration such as a triangular configuration. Also, these grooves may be the same configuration as those illustrated in FIGS. 18(a) and 18(b).

The effect of the grooves 23b and 23d formed in the third stepped portion 23 are as follows.

When the metal plate 43 (as the second metal plate) is bonded onto the horizontal plane 23h of the third stepped portion 23, the excess amount of adhesive 17 is accumulated within the groove 23b. As a result, the excess amount of adhesive is prevented from dripping to the horizontal plane 22h of the second stepped portion 22 positioned lower than the horizontal plane 23h. Therefore, the bonding portion 60b of the lead pin 60, the bonding portion 63a of the connection lead 63, the bonding portion 64a of the connection lead 64, the bonding portion 62a of the connection lead 62 and the bonding portion 65a of the connection lead 65 are maintained free of the adhesive so that a wire bonding failure will never occur.

On the other hand, with the groove 23b, the climbing of the silicon gel 16 on the first circuit board 50 to the horizontal plane 23h of the third stepped portion 23 makes it easy to adhere the adhesive on the horizontal plane 23h to successfully prevent a bonding failure between the horizontal plane 23h and the metal plate 43.

It should be noted that in order to prevent the silicon gel 16 from reaching the horizontal plane 23h of the third stepped portion 23, it may be equally effective to provide a projection on the vertical plane 22v of the second stepped portion 22 projecting perpendicular to the vertical plane 22v.

On the other hand, the excess amount of adhesive 17 also accumulates in the groove 23d. As a result, climbing of the excess amount of adhesive 17 along the vertical plane 23v of the third stepped portion can be prevented. Therefore, the adhesive 17 is prevented from adhering to the wiring pattern of the second circuit board 52. Also, the bonding portion 61b of the lead pin 61, the bonding portion 63b of the connection lead 63 and the bonding portion 62b of the connection lead 62, which are arranged on the horizontal plane 24h of the fourth stepped portion 23, are held free of the adhesive. Therefore, a wire bonding failure will never occur.

Figure 20:
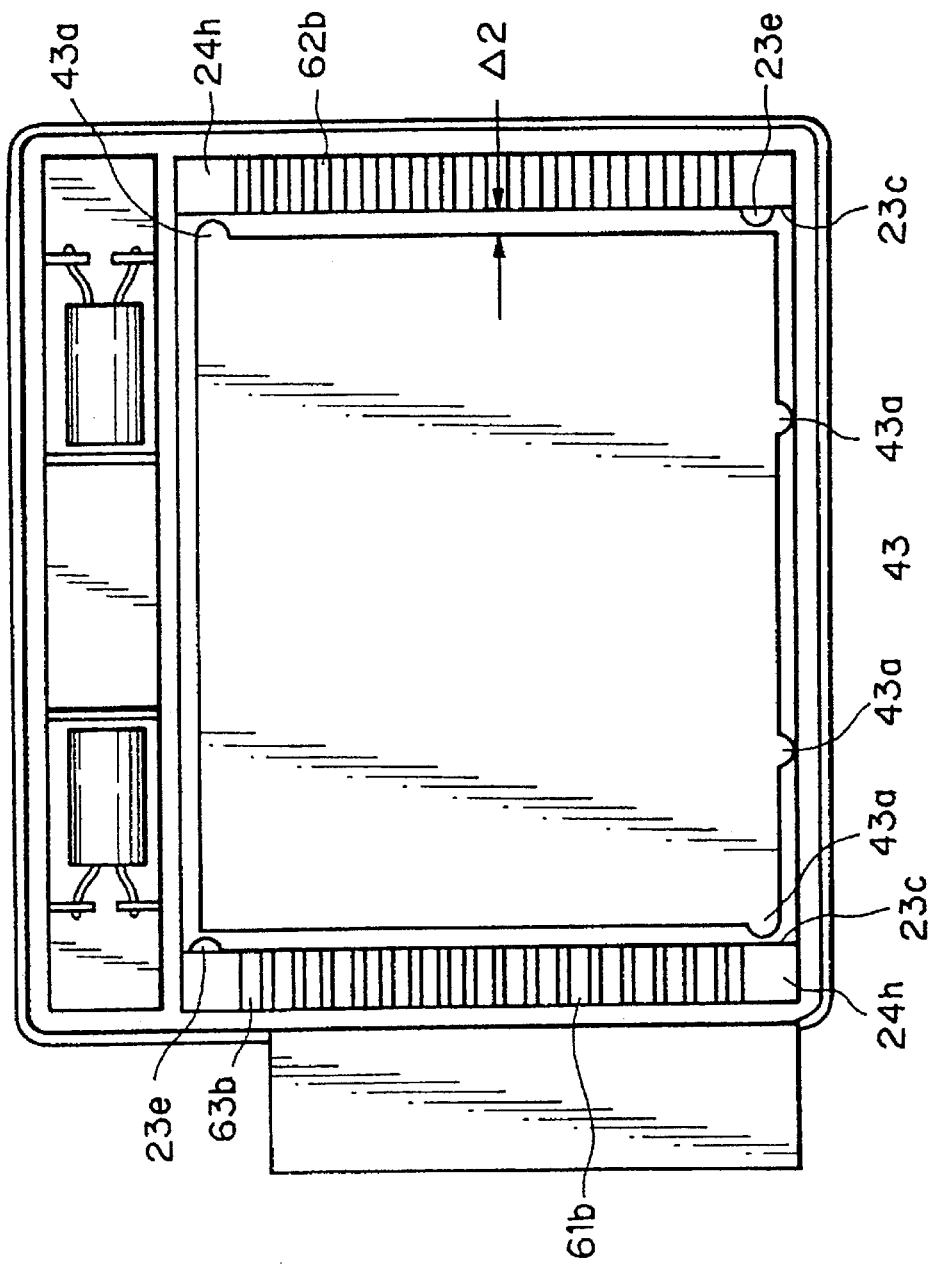
FIG. 20 is a plan view showing a construction of the third step portion mounting the second metal board.

Next, in contrast to the first electronic circuit board 50 contacting with the first closure lid member 40, when the supporting plate 43 supporting the other electronic circuit board, such as the second electronic circuit board 52, is made of the metal plate, the metal plate 43 is formed to be slightly smaller than the side defined by the outer boundary 23 of the horizontal plane 23h of the third stepped portion 23, as shown in FIGS. 19 and 20. When the metal plate 43 is mounted on the horizontal plane 23h, a small clearance Δ2 is defined between the peripheral edge of the metal plate 43 and the vertical plane 23v. On the peripheral edge of the metal plate 43, a plurality of outwardly extending (toward the vertical plane 23v) projections 43a are formed. On the other hand, on the vertical plane 23v, a plurality of inwardly extending (toward the peripheral edge of the metal plate 43) projections 23e are formed.

The effect of the projections 43a and 23e are as follows.

The projections 43a and 23e serve to position the metal plate 43 relative to the third stepped portion 23 and define the small clearance Δ2 between the peripheral edge of the metal plate 43 and the vertical plane 23v. With this clearance Δ2, the bonding portion 61b of the lead pin 61, the bonding portion 63b of the connection lead 63, the bonding portion 62b of the connection lead 62 are insulated from the metal plate 43. Also, the clearance Δ2 serves to accumulate the excess amount of bond 17 to successfully prevent the excess amount of bond 17 from climbing along the vertical plane 23v. Therefore, the adhesive will never adhere on the wiring pattern of the second circuit board 52 that mates with the metal plate 43. Also, the bonding portion 61b of the lead pin 61 and the bonding portion 62b of the connection lead 62 are maintained free of the adhesive so as not to cause a wire bonding failure.

Next, discussion will be provided for the fifth stepped portion 25 provided in the frame 10 of FIG. 5.

Figure 21:
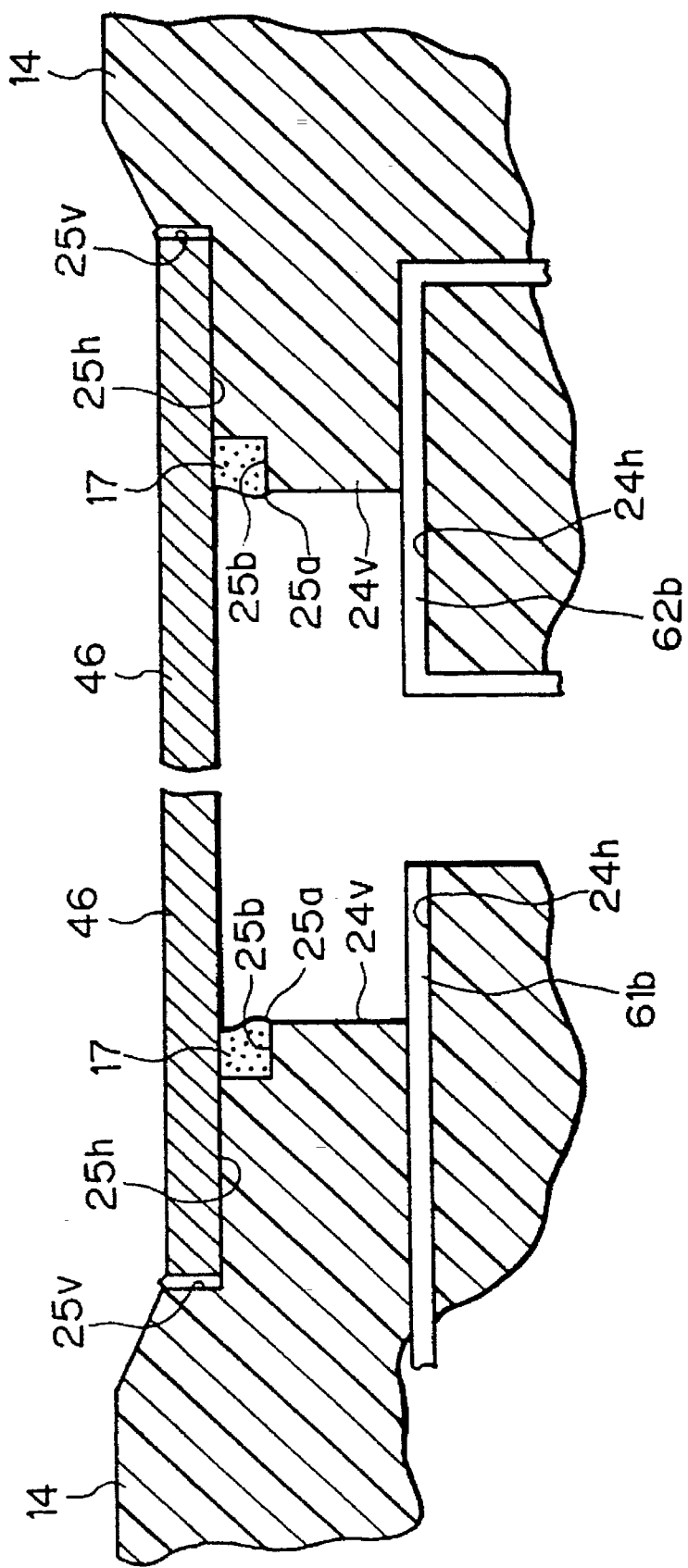
FIG. 21 is a section showing a detailed construction of a fifth step portion.

As shown in FIG. 21, the groove 25b is formed at the inner boundary 25a of the horizontal plane 25h of the fifth stepped portion 25. The groove 25b can be of any configuration, other than a rectangular configuration as shown such as a triangular configuration. Also, the groove 25b can be of the same or similar configurations to that illustrated in FIGS. 18(a) and 18(b).

The effect of the groove 25b formed in the fifth stepped portion 25 is as follows.

The metal plate 46 is bonded onto the horizontal plate 25h of the fifth stepped portion 25. At this time, the excess amount of adhesive is accumulated within the groove 25b. As a result, the excess amount of adhesive will never drip down. Therefore, the bonding portion 61b of the lead pin 61 and the bonding portion 62b of the connection lead 62 can be held free of the adhesive so that a wire bounding failure will never occur. Also, adhesion of the adhesive to the wiring pattern of the second circuit board 52 can be successfully prevented.

In addition, with the groove 25b, the climbing of the silicon gel 16 from the second circuit board 52 to the horizontal plane 25h of the fifth stepped portion 25 facilitates bonding by the adhesive. Therefore, a bonding failure between the horizontal plane 25h and the metal plate 46 can be prevented.

It should be noted that, in order to prevent the silicon gel 16 of the second circuit board 53, it is possible to provide a projection on the vertical plane 24v of the fourth stepped portion 24 so that the projection projects perpendicular to the vertical plane 24v.

Next, the construction of the lead pins 60 and 61 to be employed in the electronic device according to the present invention will be discussed.

Figure 22:
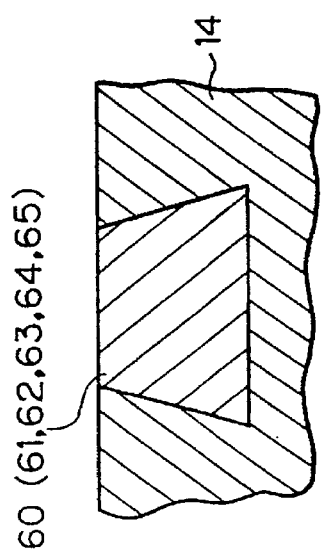
FIG. 22 is a section showing a sectional structure of the lead.

The lead pins 60 and 61 are formed by bending the flat metal plates illustrated in FIGS. 7 and 9 into the bent configurations as illustrated in FIGS. 8 and 10. The pitches of respective leads are widened from the side of the bonding portions 60b and 61b to the side of the pins 60a and 61a. With the shown construction, in which the pitches of the leads at the side of the pins 60a and 61a are set to be relatively wide and the pitches of the leads at the side of the bonding portions 60b and 61b are set to be relatively narrow, the pins can be effectively extended even when the internal space receiving the lead pin is relatively small. In addition, the lead pins 60 and 61 are of trapezoidal configuration in section, as shown in FIG. 22. With this sectional configuration, when the bonding portions 60b and 61b of the lead pins are buried in the frame in a fashion exposed from the horizontal planes 22h and 24h of the second and fourth stepped portions 22 and 24 by insert molding, detachment of these bonding portions 60b and 61b from the horizontal planes 22h and 24h can be successfully prevented.

Next, the construction of the connection leads 62, 63, 64 and 65 as intermediate members to be employed in the electronic device according to the invention will be discussed.

The connection lead 62 is formed by bending the metal plate illustrated in FIG. 15 into the bent configuration illustrated in FIG. 16. The connection lead 62 has wider pitches of respective leads at the side of the bonding portion 62b than that of the bonding portion 62a. With the shown configuration, electrical connection can be effectively established without reducing the number of leads between the first circuit board having a narrower bonding space and the second circuit board having a wider bonding space.

On the other hand, the connection lead 63 is formed by bending the flat metal plate of FIG. 11 into the bend configuration as illustrated in FIG. 12. Similarly, the connection lead 64 is formed by bending the flat metal plate of FIG. 13 into the bend configuration as illustrated in FIG. 14. Also, the connection lead 65 has a configuration symmetric to the connection lead 63. With the shown constructions of the connection leads 64 and 65, electrical connection between the circuit board 50 and the capacitors 56 and 57 provided in the capacitor box 15 formed in the frame 10 can be established.

On the other hand, the sectional configurations of the connection leads 62, 63, 64 and 65 are respectively trapezoidal as shown in FIG. 22. Accordingly, the bonding portions 62a, 63a, 64a and 65a of the connection leads 62, 63, 64 and 65 can be prevented from detaching from the horizontal plane 22h of the second stepped portion 22 when they are buried in the frame 10 by insert molding. Similarly, the bonding portions 62b and 63b of the connection leads 62 and 63 can be prevented from detaching from the horizontal plane 24h of the fourth stepped portion 24 when they are buried in the frame 10 by insert molding.

Figure 23:
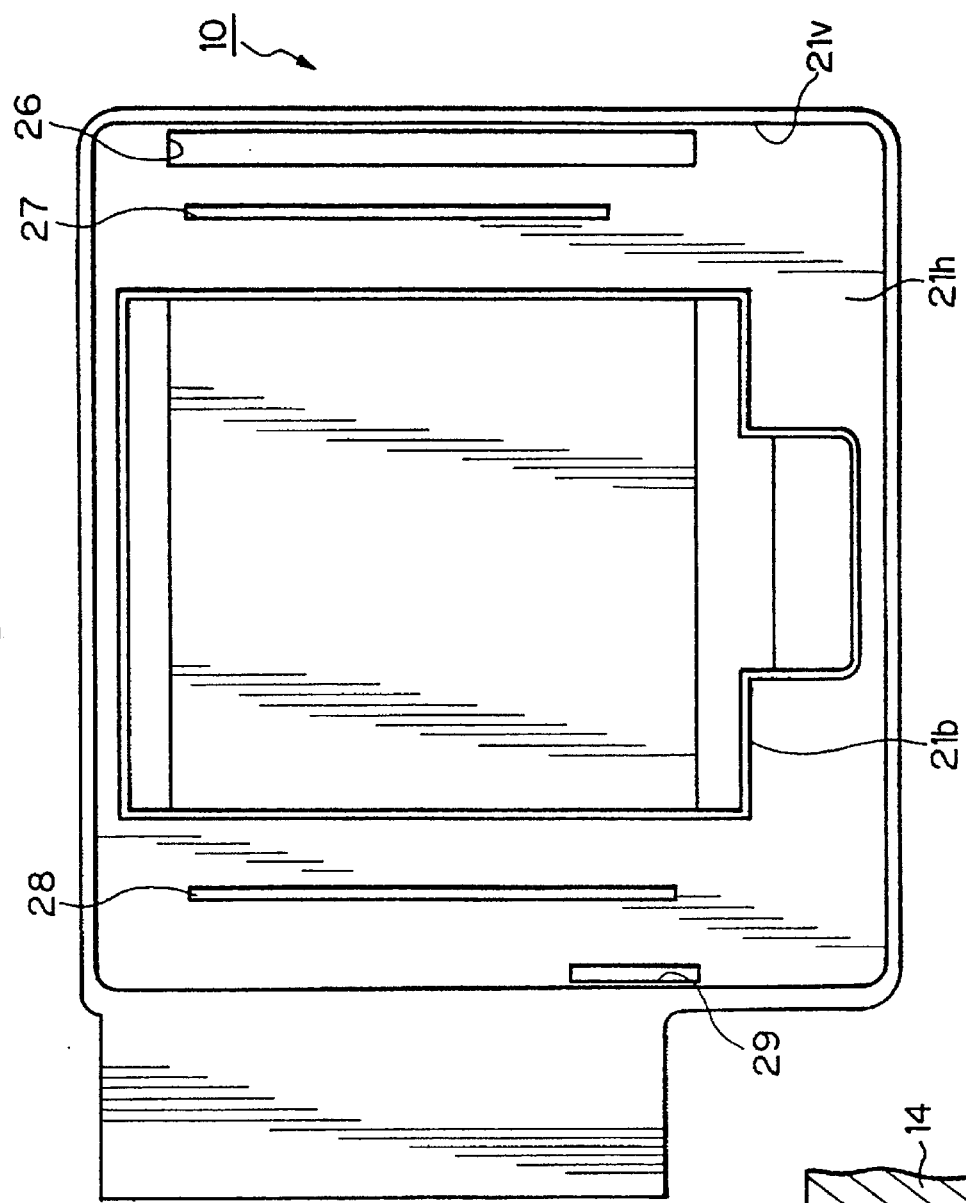
FIG. 23 is a back elevation showing the basic side construction of the frame.

On the other hand, the back side of the frame 10 is constructed as illustrated in FIG. 23. On the back side of the frame 10, grooves 26 and 29 are formed. The end 62c and the frame portion 62d of the connection lead 62 is extended into the groove 26. Similarly, the end 63c and the frame portion 63e of the connection lead 63 is extended into the groove 29. When molding of the frame, in which the connection leads 62 and 63 are inserted, is completed, the frame portions 62d and 63e of the connection leads 62 and 63 are cut within these grooves 26 and 29.

Furthermore, at the positions corresponding to the intermediate portion 62f (see FIG. 16) connected to the bonding section 62a of the connection lead 62 and the intermediate portion 60d (see FIG. 8) connected to the bonding portion 60b of the lead pin 60, windows 27 and 28 are formed. Among these, the window 27 is formed for receiving a support plate 66 that is adapted to support the connection lead 62 to prevent deformation and positional offset during a production process discussed later. These windows 27 and 28 are also used for assuring that respective leads of the connection lead 62 and the lead pin 60 are disposed in the frame without causing a short during contact, after completion of the molding.

Discussion will be provided for the manner of connection between the capacitor and the intermediate connection lead 64 as the intermediate connection member.

Figure 26:
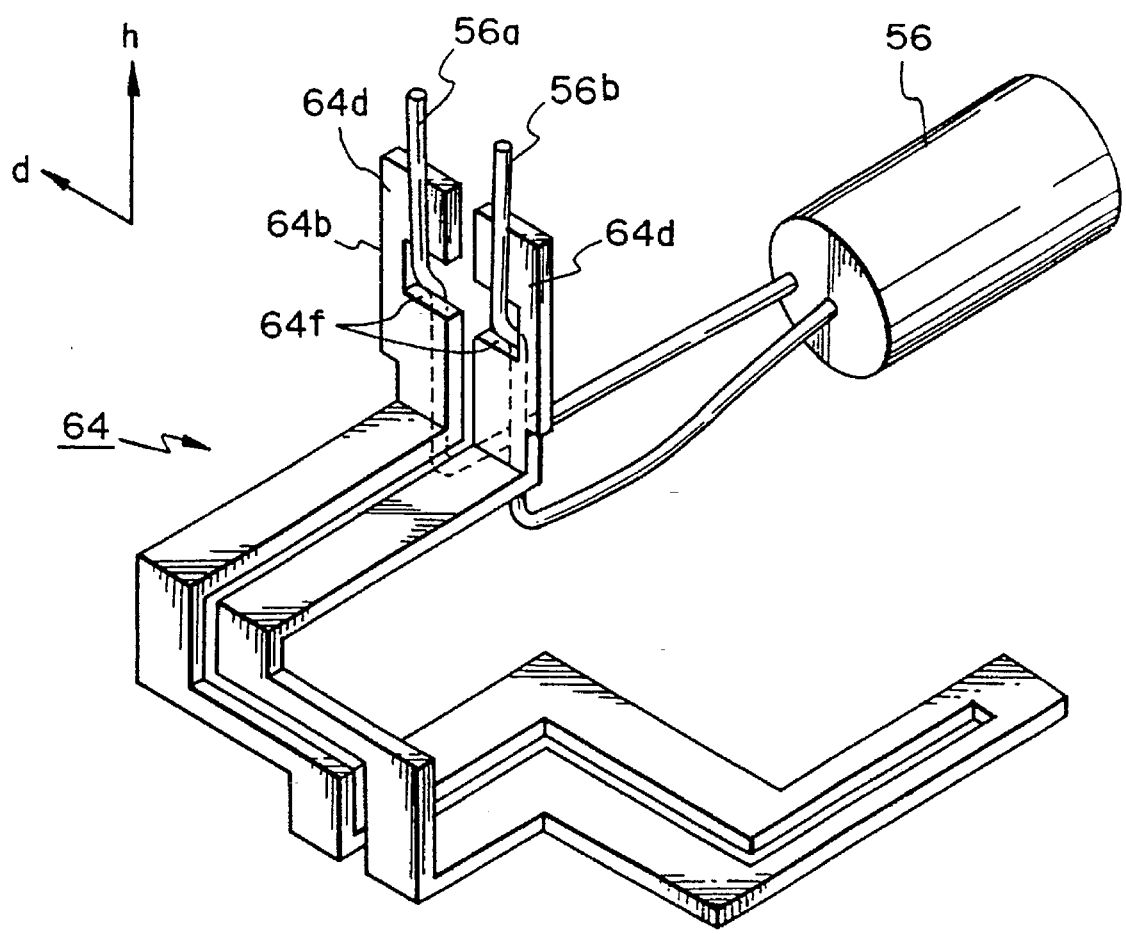
FIG. 26 is a perspective exemplary illustration showing inappropriate support by an inappropriate configuration of a connection lead during fabrication of the frame.
Figure 27:
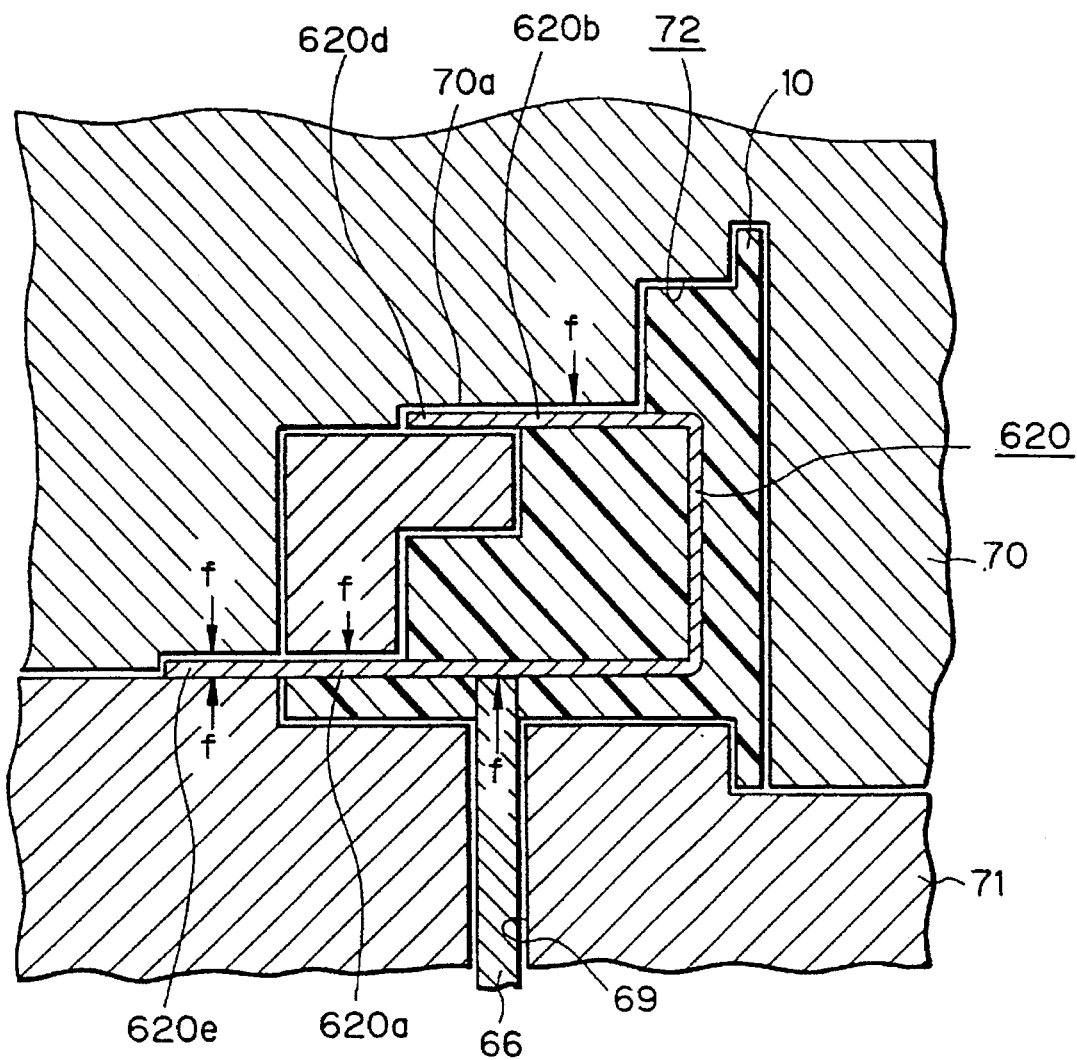
FIG. 27 is a perspective view showing the relationship between another configuration of the connection leads and a manner of supporting therefor during fabrication of the frame.

The connection lead 64 is formed in the configuration as illustrated in FIG. 26. The terminal portion 64b is formed with a welding region 64d to be connected with the leads 56a and 56b of the capacitor 56 by electric welding. The welding region 64d is formed to have a smaller length in the axial direction (h axis direction) than in the width direction (d axis direction). With such a construction, the contact areas of the leads 56a and 56b to the welding region 64d are made smaller to enable a concentration of the current during the electric welding.

Also, since the leads 56a and 56b are extended through the cut out 64f (FIGS. 29(a)–29(e), the displacement of the leads 56a and 56b from the desired position upon positioning and welding can be successfully prevented. Also, the cut-out may also serve to maintain the distance between the leads 56a and 56b so that shorting will never be occur even when the electronic device according to the invention experiences severe vibration. Furthermore, since the leads 56a and 56b are engaged with the cut-out 64, vibration energy to be transmitted to the welding portions of the leads 56a and 56b can be effectively absorbed to eliminate the possibility of a disconnection of the connecting portions.

Figures 29A, 29B, 29C:
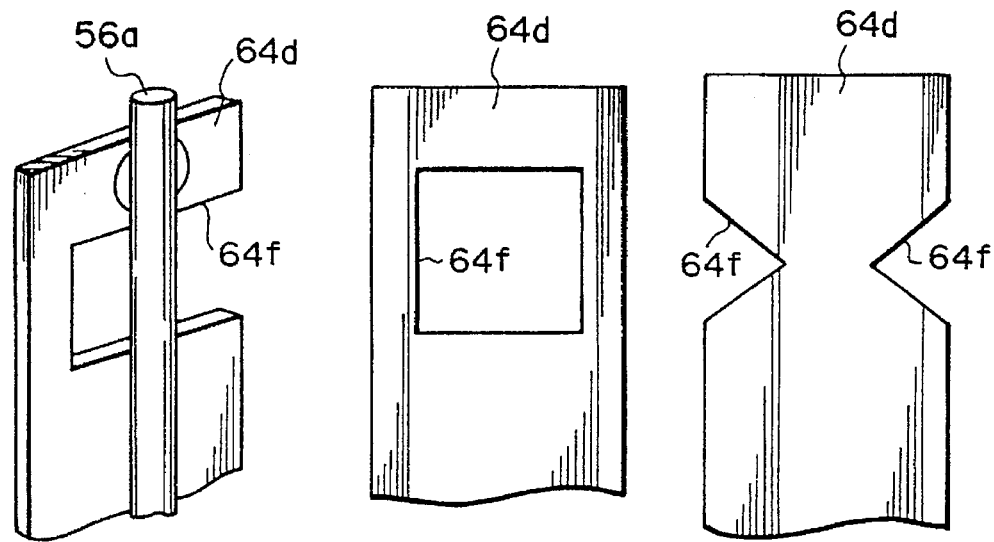
FIGS. 29(a)–29(e) are views showing another construction of the terminal portion of the connection lead.
Figures 29D, 29E:
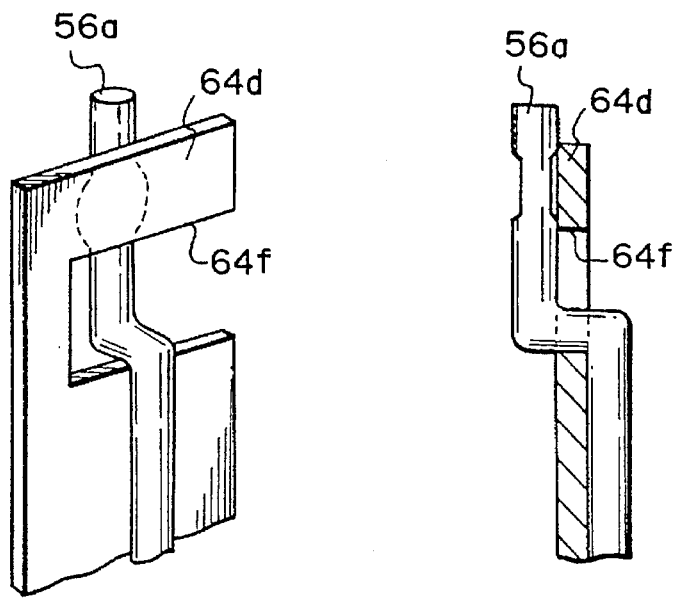

The welding region 64d and the cut-out 64f may be formed in the configuration as illustrated in FIG. 29 so as to obtain effective concentration of the welding current. Similar to that illustrated in FIG. 28, by bending the lead 56a to pass through the cut-out 64f as shown in FIG. 29(d), the displacement of the lead upon positioning and welding can be successfully prevented. Similarly, even when the electronic device is applied at a portion experiencing substantial vibration, shorting between the leads will never occur. In addition, as set forth above, since the vibration energy can be successfully absorbed, disconnection of the connecting portion will never occur.

For example, when the electronic device is disposed in the engine compartment of an automotive vehicle, transmission of the vibration to the terminal portion 64d can be successfully reduced to prevent the connecting portion from being separated.

As set forth above, the preferred construction of the lead and the intermediate connecting member to be employed in the electronic device according to the present invention comprises wire form leads, an essentially elongated strip shape of terminal, in which the leads are arranged in a direction parallel to the longitudinal axis of the terminal; the welding region at the tip end of the terminal is formed to have a length in the longitudinal direction shorter than the length of the shorter axis perpendicular to the longitudinal axis. Below the welding region, the cut-out portion is formed in the terminal.

The longitudinal axis of the terminal and the wire form leads are arranged parallel to each other. The welding region of the terminal is provided with a smaller length in the longitudinal direction than the width direction with the cut-out formed below the welding region.

Therefore, although the wire form leads have a tendency to slip in the width direction of the terminal, no substantial problem will occur by a slight offset since the length in the width direction is greater than that in the length direction. Also, by shortening the longitudinal dimension of the welding region, the contact area between the welding region and the leads can be narrowed to enable a higher concentration of the welding current.

Furthermore, the cut-out formed in the terminal contributes to accurate positioning of the leads relative to the terminal.

In summary, the electronic device according to the present invention achieves the following advantages.

(1) According to the present invention, the electronic device comprises the frame, the metal plate arranged for closing one of the openings of the frame; the first electronic circuit handling a relatively large current to generate a relatively large amount of heat is mounted on the metal plate board, and the second electronic circuit handling a relatively smaller current to generate a small amount of heat which is mounted at the intermediate position of the frame parallel to the metal plate.

Therefore, the large amount of heat generated by the first electronic circuits is radiated externally through the metal plate. On the other hand, since the amount of heat generated by the second electronic circuit is small, sufficient heat radiation effect can be obtained even by radiation of the heat into the internal space of the frame and by heat radiation to the second circuit board and the frame.

(2) According to the invention, the electronic device also comprises the first and second circuit boards, first and second lead pins having a multi-pin structure extending from the inside to the outside through the frame and connected with the first and second circuit boards at respective inner ends, a connecting member maintained at the inside of the side wall of the frame at the side opposite the side where the first and second lead pins are arranged in the stepwise bent fashion, first connecting portion arranged and exposed to the horizontal surface of the stepped portion formed in stepwise fashion at the inside of the side wall of the frame and electrically connected to the connecting portion of the first circuit board and second connecting portion arranged and exposed to the horizontal plane of another stepped portion formed on the side wall and electrically connected to the connecting portion of the second circuit board.

Accordingly, by employing the connected leads buried in stepwise bent fashion in the frame of the multi-lead structure, the first and second circuit boards arranged in a two stage structure can be easily connected. In this case, the number of connection lines can be increased up to the number determined by the dimension of the device. Also, the external input and output of the signals is performed through specialized lead pins and an electrical connection between the circuit boards is established by specialized connection leads. Therefore, it becomes unnecessary to provide the dummy lead pin for connecting between the circuit boards so that lead pins can be effectively used.

(3) According to the present invention, the electronic device further comprises an intermediate connecting member held in a stepwise bent condition in the side wall of the frame, which is so arranged that the horizontal plane of one of the stepped portions is exposed to the first connecting portion and the horizontal plane of another stepped portion is exposed to the second connecting portion, which establishes an electrical connection with the connecting portion of the second circuit board.

At one side of the frame, with the intermediate connection lead, i.e. the intermediate connection member buried in the frame, an electrical connection between the first and second circuit boards can be facilitated. Also, the number of connection lines can be increased up to the number determined by the dimension of the device.

In the production process of the electronic device as set forth above, when the frame is molded by setting the connection lead as an insert, the connection leads are arranged on the surface forming the cavity of the mold. A comb-shaped support plate extended toward inside of the cavity from the surface forming the cavity of the mold so as to engage with a plurality of metallic leads at the extended portions. When the connection lead is thus fixed in the cavity, molding of the frame is performed.

Accordingly, with the depression force on the supporting plate, the stepwise bent connection leads can be firmly fitted onto the cavity surface of the mold and thus can be arranged in correct attitude. By performing molding at this position, the first and second connecting portions of the connection lead can be buried exposing the surface of the horizontal planes. As a result, the electronic device according to the invention can minimize the occurrence of defects.

(4) Also, according to the present invention, the electronic device comprises a frame including stepped inner wall having horizontal planes supporting peripheral portions of the circuit boards, vertical planes restricting the position of the circuit boards in the horizontal direction and extending from the horizontal planes; the circuit board having a size so as to be supported by the horizontal plane and to form a clearance with respect to the vertical plane, and a projection projecting toward the clearance for contacting with the vertical plane or the peripheral edge of the circuit board is formed on the peripheral edge of the circuit board or the vertical plane.

Accordingly, when the circuit board is arranged on the stepped portion of the frame between the peripheral edge of the circuit board and the vertical plane, the clearance is formed because of the presence of the projection. The back side of the peripheral portion of the circuit board is bonded to the horizontal plane by the adhesive, the excess amount of adhesive can be trapped within this clearance, and therefore, the excess amount of adhesive will never flow onto the circuit board. Also, a plurality of leads are formed on the frame in the vicinity of the circuit board for a wiring connection with the circuit board. With the shown construction, the adhesive will never adhere on these leads, and accordingly, the adhesive will not adversely effect the electronic circuit mounted on the circuit board. Also, the adhesive will not adhere to the bonding portion and the lead and thus will never be a cause of connection failure.

(5) In the electronic device according to the present invention, the frame has a stepped portion formed in a stepwise fashion on the inner wall of the frame, which has horizontal planes for supporting the peripheral portion of the circuit board or a closure lid of the casing, and grooves formed at the side of the inner boundary in the horizontal plane.

Accordingly, when the circuit board or the closure lid member is bonded on the horizontal plane of the stepped portion, the excess amount of adhesive accumulates within the groove and will never drip down. As a result, the adhesive will not adhere to the electronic circuit mounted on the circuit board, the bonding portions of the circuit board or the connection leads electrically connecting the circuit boards disposed in the frame. Therefore, adverse effects, wire bonding failure or degradation of heat radiation effect can be successfully prevented.

Alternatively, according to the invention, the stepped portion on the inner wall of the frame is formed in a stepwise fashion with horizontal planes for supporting the peripheral portion of the circuit board and the closure lid members of the casing and vertical planes defining a position arranging the circuit board and the closure lid member of the casing in the horizontal direction and extending from the horizontal planes, and grooves formed in the vicinity of the boundary between the horizontal planes and the vertical planes.

With the foregoing construction, when the circuit board is bonded onto the horizontal plane the excess amount of adhesive is trapped in this groove. Therefore, the excess amount of adhesive will never flow up along the vertical plane. As a result, the adhesive will not adhere to the electronic circuit mounted on the circuit board, the bonding portions of the circuit board or the connection leads electrically connecting the circuit boards disposed in the frame. Therefore, adverse effects, wire bonding failure or degradation of heat radiation effect can be successfully prevented.

Furthermore, according to the invention, in the electronic device having a multi-board structure of a plurality of circuit boards mounting electronic circuits and coated by a gel form coating agent, the inner wall of the frame is formed with stepped portions for restricting the upper surface of the coating agent that coats the circuit board.

Since the stepped portion that defines the upper surface of the gel form coating agent is formed on the inner wall of the frame, the coating agent is restricted to the upper surface by the surface tension thereof and will never leak upward. Since the gel form coating agent will not climb up to the horizontal plane of the stepped portion supporting other circuit boards thus will never adhere to the connection lead, bonding failure or connection failure will not occur.

(6) On the other hand, according to the present invention, the frame has a horizontal portion contacting with the peripheral portion of the wired surface of the circuit board and bonded therewith by the adhesive, in which the wired surface of the circuit board has a dummy wiring with a circuit pattern formed inside while maintaining a substantially small clearance relative to the inner boundary of the contacting region where it makes contact with the horizontal plane. In addition, a cut out is formed at the side of the inner boundary of the horizontal portion of the stepped portion.

In the construction set forth above, the excess amount of adhesive can be trapped within the small clearance between the inner boundary and the dummy wiring so that the adhesive is prevented from flowing beyond the dummy wiring. Accordingly, the electronic circuits mounted on the circuit boards will never be influenced by such excess amount of adhesive. Also, in the shown embodiment, the adhesive will never adhere to the connecting portion to cause a connection failure. In addition, cracking and degradation of the heat radiation effect owing to the difference of the thermal expansion coefficients or viscosities between the circuit board and the adhesive can be prevented.

Furthermore, in the present invention, the electronic device comprises wire form leads, an essentially elongated strip shape of terminal, in which the leads are arranged in a direction parallel to the longitudinal axis of the terminal; the welding region at the tip end of the terminal is formed to have a length in the longitudinal direction shorter than the length of the shorter axis perpendicular to the longitudinal axis. The cut-out portion is formed in the terminal below the welding region.

Therefore, although the wire form leads have a tendency to slip in the width direction of the terminal, no substantial problem will occur by a slight offset since the length in the width direction is provided to be greater than that in the length direction. Also, by shortening the longitudinal dimension of the welding region, the contact area between the welding region and the leads can be narrowed to enable a higher concentration of the welding current.

Furthermore, the cut-out formed in the terminal contributes to accurate positioning of the leads relative to the terminal.

What is claimed is:

1. An electronic device comprising:
   a casing including a frame having a stepped portion;
   circuit boards with electronic circuits mounted thereon, said circuit boards arranged in parallel and spaced from each other within said casing, said stepped portion defining a horizontal plane that supports a peripheral edge portion of at least one of said circuit boards and a vertical plane extending from said horizontal plane, said circuit boards including:
   a first circuit board mounted and engaged with said frame so as to and
   a second circuit board mounted and arranged inside said frame such that a space exists between said first circuit board and said second circuit board said second circuit board including at least one wire-bonded portion; and
   a reinforcing plate disposed on a side of said second circuit board facing said space, said reinforcing plate having a stiffness necessary to enable a predetermined amount of wire-bonding energy to be completely applied to a portion thereof adjacent to said wire-bonded portion of said second circuit board.

2. An electronic device according to claim 1, wherein said stepped portion supports a peripheral edge portion of said second circuit board.

3. An electronic device according to claim 1, wherein said wire-bonding energy is ultra sonic wave energy.

4. An electronic device according to claim 2, wherein said wire-bonding energy is ultra sonic wave energy.

5. An electronic device according to claim 2, further comprising a wire-bonding portion formed on said stepped portion.

6. An electronic device according to claim 1, further comprising a connecting lead inserted into said frame that electrically connects said first and second circuit boards to each other.

* * * * *